(12) United States Patent
Osaka et al.

(10) Patent No.: US 6,978,328 B1
(45) Date of Patent: Dec. 20, 2005

(54) BUS SYSTEM, MEMORY SYSTEM, PRINTED CIRCUIT BOARD AND DIRECTIONAL COUPLER

(75) Inventors: Hideki Osaka, Oiso (JP); Takashi Tsunehiro, Ebina (JP); Koichi Kimura, Kamakura (JP); Susumu Hatano, Higashimurayama (JP); Kazuya Ito, Hamura (JP); Toshio Sugano, Kotsubo (JP); Toyohiko Komatsu, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/570,349

(22) Filed: May 12, 2000

(30) Foreign Application Priority Data

May 12, 1999 (JP) ................................. 11-130957
Apr. 20, 2000 (JP) .............................. 2000-126234

(51) Int. Cl.⁷ ............................................. G06F 1/00
(52) U.S. Cl. ........................... 710/107; 365/63; 365/52
(58) Field of Search ................................ 710/305–315, 710/104–110; 711/147–148, 169; 365/52, 365/230.3, 63, 226, 230.03

(56) References Cited

U.S. PATENT DOCUMENTS

| | | | |
|---|---|---|---|
| 3,516,065 A | 6/1970 | Bolt et al. | |
| 3,619,504 A | 11/1971 | De Veer | |
| 3,764,941 A | 10/1973 | Nick | |
| 3,786,418 A | 1/1974 | Nick | 375/257 |
| 4,380,080 A | 4/1983 | Rattlingourd | 375/257 |
| 5,119,398 A | 6/1992 | Webber, Jr. | 375/257 |
| 5,126,910 A | 6/1992 | Windsor et al. | 365/52 |
| 5,229,398 A | 7/1993 | Malen et al. | |
| 5,241,643 A | 8/1993 | Durkin et al. | 365/52 |
| 5,365,205 A | 11/1994 | Wong | 333/109 |
| 5,376,904 A | 12/1994 | Wong | 333/109 |
| 5,449,112 A * | 9/1995 | Heitman et al. | 236/49.3 |
| 5,515,195 A * | 5/1996 | McAdams | 385/42 |
| 5,638,402 A | 6/1997 | Osaka | |
| 5,811,972 A * | 9/1998 | Thompson et al. | 324/338 |
| 5,945,886 A | 8/1999 | Millar | 174/250 |
| 6,137,709 A | 10/2000 | Boaz et al. | 365/51 |
| 6,172,895 B1 | 1/2001 | Brown et al. | 365/52 |

(Continued)

FOREIGN PATENT DOCUMENTS

JP          7141079          6/1995

(Continued)

OTHER PUBLICATIONS

R. Poon, "Computer Circuits Electrical Design", Principal Engineer and Manager of Circuit Engineering, Amdahl Corp., pp. 194-207.

(Continued)

Primary Examiner—Paul R. Myers
Assistant Examiner—Raymond N Phan
(74) Attorney, Agent, or Firm—Mattingly, Stanger, Malur & Brundidge, P.C.

(57) ABSTRACT

A bus system for carrying out data transfer between one bus master and a plurality of bus slaves. The bus system includes plural directional couplers which are formed by arranging respective parts of lines drawn from the bus slaves, without being in contact with, in the neighborhood of, and in parallel with a line drawn from the bus master. The line drawn from the bus master to a terminating resistance is wired to be folded. The directional couplers are further formed by arranging parts of the lines drawn from the bus slaves alternatively with respect to a first line part of the line drawn from the bus master ranging from the bus master to a fold of the line drawn from the bus master and with respect to a second line part of the line drawn from the bus master ranging from the fold to the terminating resistance.

18 Claims, 24 Drawing Sheets

U.S. PATENT DOCUMENTS

| | | | |
|---|---|---|---|
| 6,366,520 B1 | 4/2002 | Huber | 365/226 |
| 6,438,012 B1 * | 8/2002 | Osaka et al. | 365/52 |
| 6,654,270 B2 * | 11/2003 | Osaka et al. | 365/51 |

FOREIGN PATENT DOCUMENTS

JP            8188366         7/1996

OTHER PUBLICATIONS

Taguchi, et al, "Comparison of Small Amplitude Interfaces for bus systems for 100 MHz era", Nikkei Electronics, No. 591, Sep. 27, 1993, pp. 269-290.

"Limits of Electrical Signaling (Transmitter Equalization)", IEEE HOT Interconnect V (Sep. 21-23, 1997).

"Limits of Electrical Signaling (Transmitter Equalization)", IEEE HOT Interconnect V (Sep. 21-23, 1997), p. 48.

S. Honda, "Present and Future of Technologies for Build-up Type Multilayer Boards", S.C. Laboratory, Inc., Tokyo, Japan, pp. 462-468.

P. Allen, et al, "CMOS Analog Circuit Design", Comparator with Hysteresis, pp. 347-357.

* cited by examiner

LAYER STACKING

LAYER STACKING

TIME
MC DRIVE

TIME
CHIP DRIVE

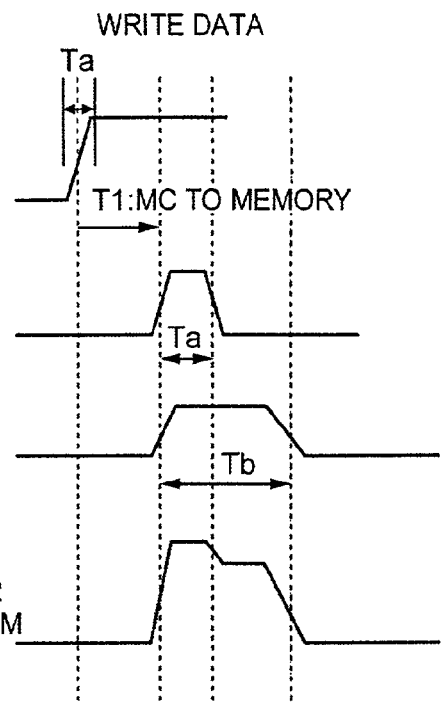
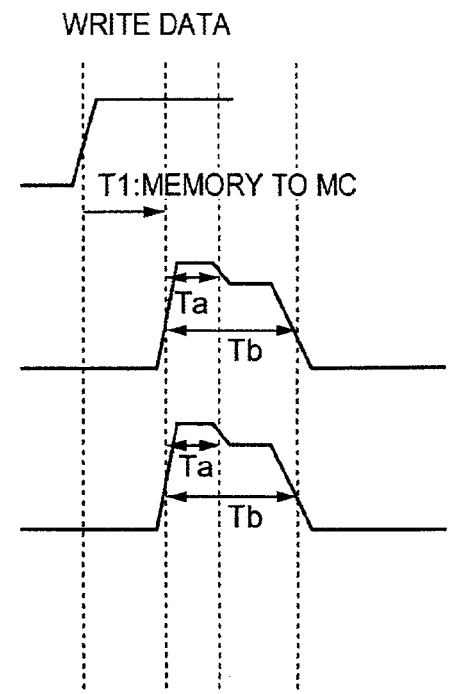

BUS SYSTEM, MEMORY SYSTEM, PRINTED CIRCUIT BOARD AND DIRECTIONAL COUPLER

BACKGROUND OF THE INVENTION

1. Field of the Invention

The present invention relates to a technique of signal transmission between devices such as multiple processors and memories (for example, between digital circuits constructed by CMOSs or between their functional blocks) in an information processing apparatus, and in particular to a technique for speeding up bus transmission which a plurality of elements are connected to a same transmission line for transferring data. In particular, the present invention relates to a bus to which a plurality of memory modules and a memory controller are connected and to a system using that bus.

2. Description of Related Art

As a bus system that is connected with many nodes and intended for high-speed data transfer, is mentioned a non-contact bus line of Japanese Unexamined Patent Laid-Open No. 7-141079 (U.S. Pat. No. 5,638,402). FIG. 5 shows the basic system of the conventional technique. In this technique, data transfer between two nodes is realized by utilizing crosstalk, i.e., using a directional coupler. Namely, FIG. 5 shows a technique in which transfer between a bus master 10-1 and slaves 10-2–10-8 is carried out utilizing crosstalk between two lines, i.e., between the line 1-1 and a line 1-2–1-8. The technique of FIG. 5 is suitable for transfer between the bus master 10-1 and the slaves 10-2–10-8, or data transfer between a memory controller and memories.

However, in the conventional technique of 7-141079 (U.S. Pat. No. 5,638,402), the line length occupied by a directional coupler decides module intervals. Accordingly, in order to shorten the module intervals, it is necessary to shorten the line length of the directional coupler. However, shorter line length becomes a cause of reducing the transmission efficiency, i.e., degree of coupling, and thus, it is impossible to make each interval less than certain length. Thus, a first problem is to realize high-density mounting of memories by making intervals between memory modules smaller.

A second problem is that, as transmission speed becomes higher in high-speed data transmission, waveform distortion increases owing to frequency-dependent effects such as the skin effect. This appears as a phenomenon that pulse waveform becomes dull at its rising and falling shoulders, and owing to this influence, appears as an increase of skew when a receiver takes in the pulse waveform. Namely, since the shoulders of the pulse waveform inputted into the receiver become dull, time when a signal exceeds or falls short of the receiver's reference voltage (Vref) increases. As a result, receiver's take-in time increases, causing the increase of the skew.

The reason why the skin effect makes the shoulders of the pulse dull is described as follows.

A high-speed pulse has a high-frequency component depending on the reciprocal of its transition (rise or fall) time. For example, the frequency bank (fknee) of a pulse having the transition time Tr can be written by the following equation:

$$fknee = 0.35/Tr \quad (1)$$

Accordingly, when it is assumed that a pulse of 1 Gbps is transmitted and 30% of it is the transition time, then, fknee=0.35/(0.3 [ns])~1 GHz. In this case, resistance increase owing to the skin effect is calculated as follows.

The volume resistivity ρ of copper at 20 [° C.] is 1.72*10^−8 [Ω·m]. In the case of a standard line (linewidth 0.1 [mm] and line thickness 0.030 [mm]) in a board, DC resistance becomes 5.7 [mΩ/mm]. Here, "^" expresses the power. Further, resistance per unit length owing to the skin effect is:

$$r = 2.6 \times 10^{\wedge} - 6\sqrt{f}\,[\Omega/mm] \quad (2)$$

and, at 1 GHz, it becomes:

$$r = 82\,[m\Omega/mm].$$

Thus, in comparison with the DC resistance 6 [mΩ/mm], the resistance in the transmission time increases 13 times. Namely, the high resistance appears only at the transition time, and this leads to the dull wave waveform. This is because a resistance component becomes larger as the frequency becomes higher, thus having larger effects at rising and falling times. As a technique for overcoming this, a driver can be used to make the pulse waveform steeper at the transition (rise and fall) times. For example, an article, "Limits of Electrical Signaling (Transmitter Equalization)"; IEEE HOT interconnect V (1997, 9/21–23), pp. 48 describes an equalizer system using DAC (Digital Analog Converter) of a driver (transmitter). This is realized in the driver by changing transition waveform steeply all the more when the quantity of dullness is larger. In the case of using this technique, the driver becomes complex and it is difficult to mount many devices on LSI.

As a third problem, a plurality of memories have different line lengths depending on their distances from a memory controller. This causes time differences in read and write data. Data arrival times are different depending on chip locations, and its correction makes system design very difficult. Thus, removal of these time differences is a problem.

SUMMARY OF THE INVENTION

As a means for solving the first problem, a line (main line) from a memory controller is folded, and directional couplers are formed both with respect to a line part before the fold and with respect to a line part after the fold. As a result, pitch of modules can be shortened, while wiring length of each coupler is maintained, and high-density mounting can be realized.

As a means for solving the second problem, a directional coupler that can generate forward crosstalk is formed in a T-shape. As a result, the backward crosstalk component and the forward crosstalk component are superposed into an NRZ signal in a transition time. By this operation, waveform can be sharpened, and dulling of waveform owing to, for example, the skin effect can be equalized. As a result, it is not necessary to specially control a driver, and LSI is simplified.

As a means for solving the third problem, a main line is folded, and a switch is provided for connecting to one of both ends of the main line. This switch is turned to switch the connection in a read cycle and in a write cycle. By this, differential delay that depends on positions can be eliminated, and system design becomes easy. Further, this becomes possible by utilizing the characteristic that, by using the T-shaped directional coupler of the means for solving the second problem for connecting a memory chip, signals are generate in both directions.

BRIEF DESCRIPTION OF THE DRAWINGS

FIG. 18 is an explanatory view for the memory system using the T-shaped couplers (in write operation);

FIG. 19 is an explanatory view for the memory system using the T-shaped couplers (in read operation);

DESCRIPTION OF THE PREFERRED EMBODIMENT

Figure 1:
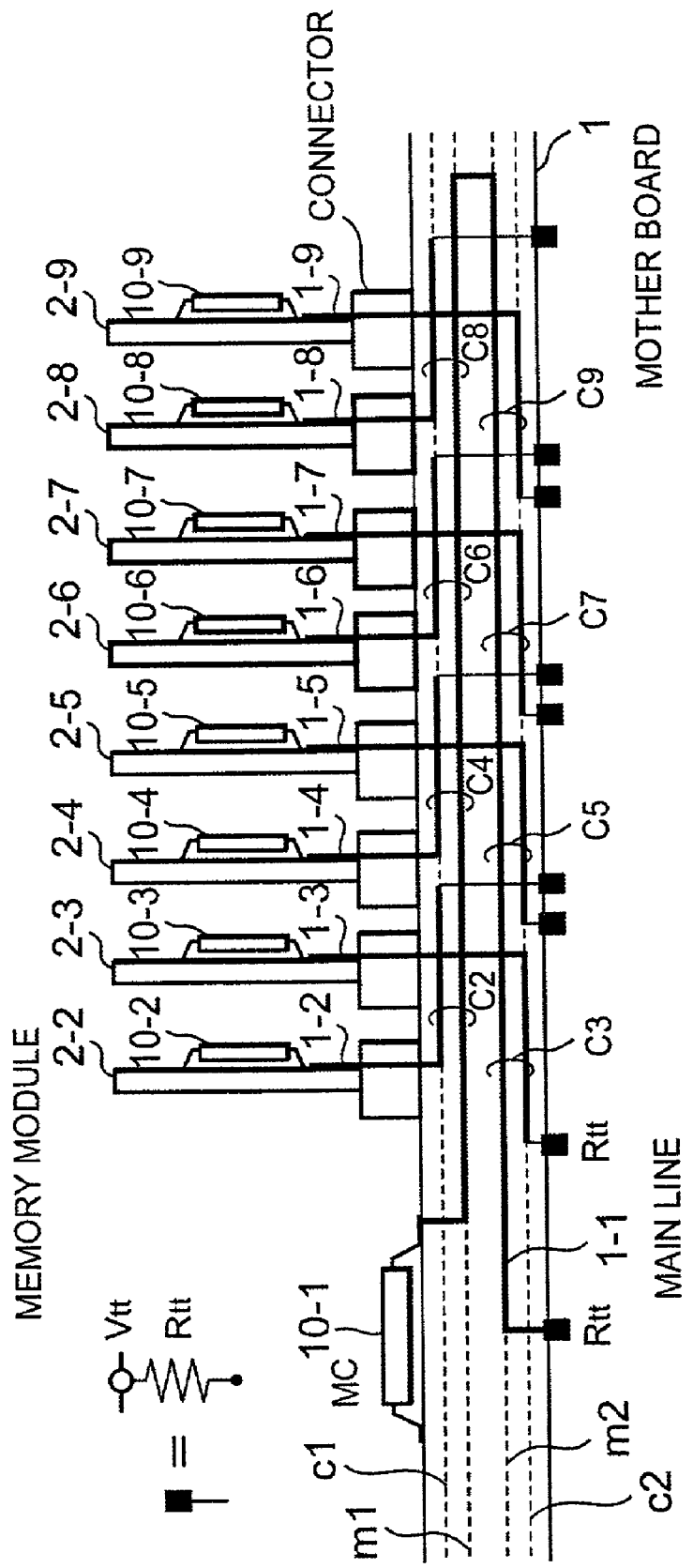
FIG. 1 is an explanatory view showing a first embodiment.

A first embodiment will be described referring to FIG. 1.

A reference numeral 10-1 refers to an LSI chip (hereinafter referred to as MC: Memory Controller) having a control function as a memory controller, and 2-2–2-9 to memory modules each mounted with a plurality of memory chips 10-2–10-9. A printed circuit board 1 is a mother board that is mounted with MC 10-1 and the memory modules 2-2–2-9 and has lines permitting data transfer between MC 10-1 and the memory chips 10-2–10-9 within the memory modules 2-2–2-9. The memory modules 2-2–2-9 are connected to the mother board via connectors.

MC 10-1 carries out operations of data read and write into the memory chips 10-2–10-9. Reference numerals 1-1–1-9 refer to lines for data transfer carried out for those read and write operations. Among these lines, the line 1-1 connected to MC 10-1 is particularly called a main line.

Broken lines m1, c1, m2 and c2 within the mother board refer to signal layers within the board, respectively. One end of each line 1-1–1-9 is connected to MC 10-1 or a memory chip 10-2–10-9, and the other end is connected to a terminating voltage Vtt via a terminating resistance Rtt. This terminating resistance Rtt connected to the terminating voltage Vtt is expressed by a black rectangle (■). This terminating resistance has an almost same value as a line characteristic impedance of each line 1-1–1-9. Accordingly, those terminations operate to absorb signals from the lines 1-1–1-9, preventing generation of reflection.

Data transfers between MC 10-1 and the memory chips 10-2–10-9 are carried out through directional couplers C2–C9 each shown as a reversed letter "C". These directional couplers are equivalent to ones of 7-141079 (U.S. Pat. No. 5,638,402). Namely, data transfer between two nodes is carried out utilizing crosstalk (in a directional coupler) as coupling between two parallel lines. Thus, transfer between MC (bus master) 10-1 and a memory chip (bus slave) 10-2–10-9 is carried out utilizing crosstalk between two lines, i.e., the main line 1-1 and a line 1-2–1-9. This crosstalk signal is generated with regard to an edge of a drive pulse, and after a certain time, returns to the terminating voltage. Accordingly, when the drive signal is a rectangular wave of an NRZ signal, then, a signal generated by a directional coupler can be regarded as an RTZ (Return To Zero) signal. In this sense, the directional coupler is a converter from an NRZ signal to an RTZ signal.

Figure 5:
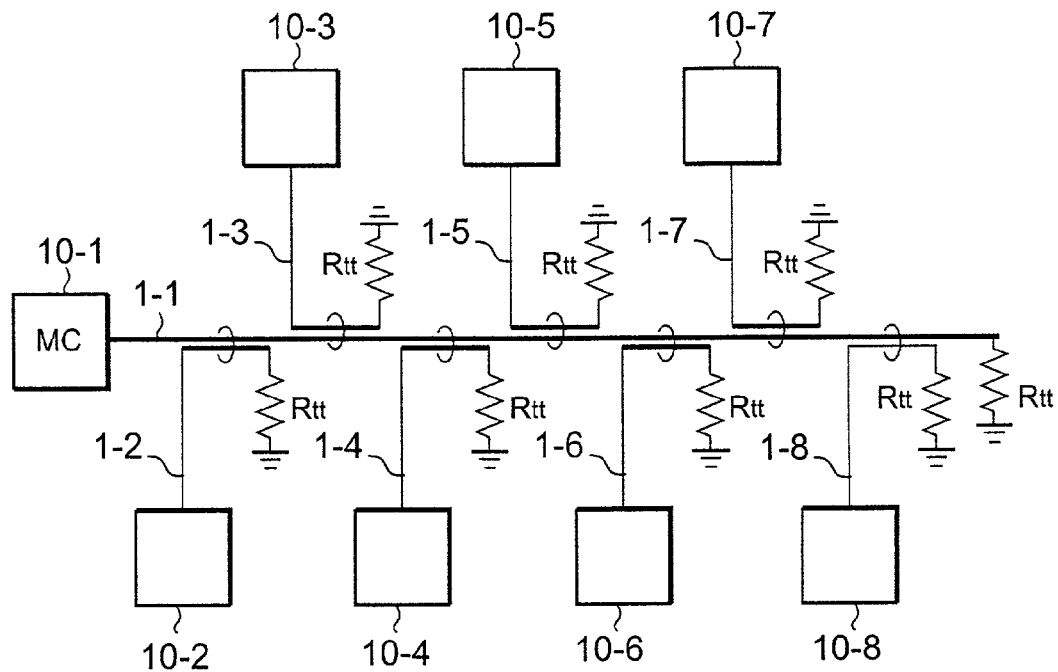
FIG. 5 shows the conventional system.

In 7-141079 (U.S. Pat. No. 5,638,402), there is a problem that an interval (pitch) between the memory modules 2-2–2-9 mounted on the mother board 1 can not be less than the length of each coupler, since the directional couplers are serially arranged (FIG. 5).

On the other hand, in the present embodiment, wiring of the main line 1-1 is arranged on the layer m1 from MC 10-1 toward the right in the figure, moves onto the layer m2 at the right end of the mother board 1, being folded toward the left in the figure, and thereafter is terminated. On the layer m1, the main line 1-1 constitutes the couplers C2, C4, C6 and C8 with the lines 1-2, 1-4, 1-6 and 1-8 on the layer c1. Further, on the layer m2, the main line 1-1 constitutes the couplers C9, C7, C5 and C3 with the lines 1-9, 1-7, 1-5 and 1-3 on the layer c2. Here, the couplers C2, C4, C6 and C8 are formed (in an upper layer) between the m1 layer and the c1 layer of the mother board 1, and the couplers C3, C5, C7 and C9 are formed (in a lower layer) between the m2 layer and the c2 layer of the mother board 1.

The couplers C2–C9 are serially arranged with respect to the main line 1-1 such that the characteristic impedance of the lines becomes constant. Further, they are arranged and wired such that data transfer between MC 10-1 and the memory chips 1-2–1-9 is carried out utilizing backward crosstalk in any coupler. Namely, although the couplers C2, C4, C6 and C8 in the upper layer of the main line 1-1 and the couplers C9, C7, C5 and C3 in the lower layer are wired in the opposite directions, they are wired in the same direction in relation to the main line 1-1. Thus, they are arranged such that backward crosstalk is generated in any transfer.

As shown in FIG. 1, the main line 1-1, which is wired as one side of the couplers, is folded once from one layer (m1) to the other layer (m2), so that the couplers can be formed in each layer. This can make the intervals of the memory modules 2-2–2-9 about half the wiring length of the directional couplers C2–C9. Accordingly, the memory modules can be mounted at high density on one mother board 1. In this case too, the coupling length required for coupling is same and quantity of coupling required for signal propagation is same as the conventional technique shown in FIG. 7. Thus, signal waveform quality is equivalent.

In other words, the conventional technique has a problem that, the interval (pitch) between the memory modules 2-2–2-4 mounted on the mother board 1 as shown in FIG. 5 can not be smaller than the length of each coupler, since the directional couplers are serially arranged. However, by folding the main line as shown in FIG. 1, the interval (pitch) between the memory modules 2-2–2-4 mounted on the mother boards 1 can be half the length of each coupler, and thus high density mounting can be realized, taken as the system.

Figure 2:
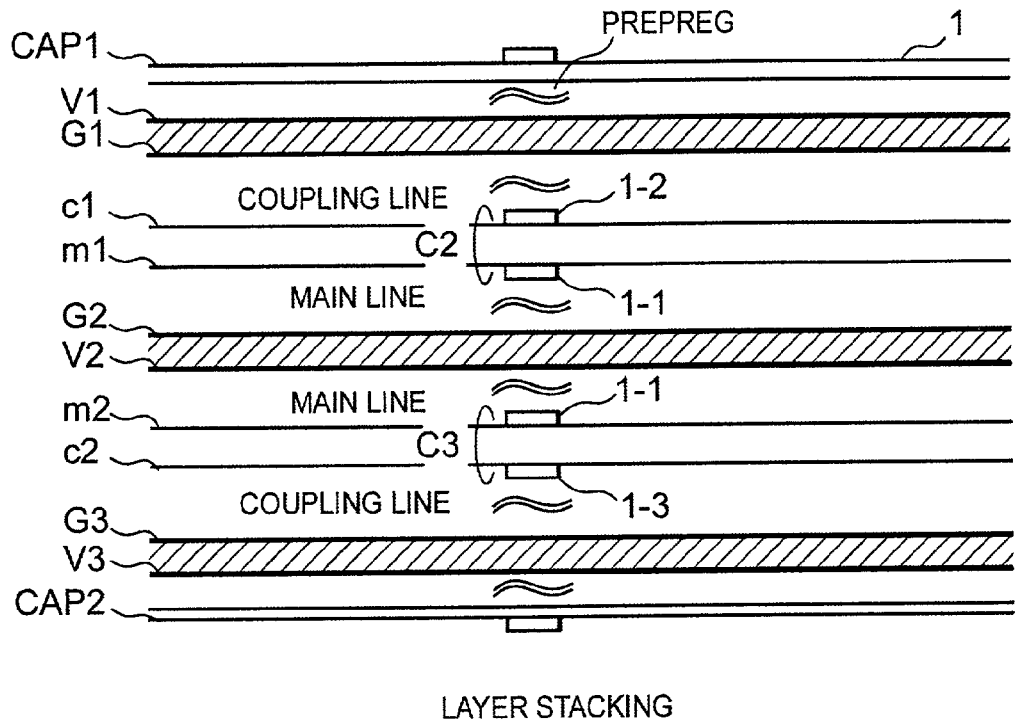
FIG. 2 is a view showing the board structure of the first embodiment.

FIG. 2 shows an example of layer structure of the mother board 1. FIG. 2 is a cross section in a vertical direction to the main line 1-1 of the mother board 1 showing in FIG. 1. The example of FIG. 2 shows CAP1 layer, a power supply layer (V1), a ground layer (G1), a signal layer (m1), a signal layer (c1), a ground layer (G2), a power supply layer (V2), a signal layer (m2), a signal layer (c2), a ground layer (G3), a power supply layer (V3), and CAP2 layer. Generally, a printed circuit board is formed by adhering copper-clad boards, each of which is covered with copper on both sides, using prepreg. In the figure, prepreg is shown by a double wavy line.

Parallel lines 1-1 and 1-2, which are arranged in parallel in the layers above and below the layers m1 and c1, constitute the directional coupler C2 of FIG. 1. Similarly, parallel lines 1-1 and 1-3, which are arranged in the layers above and below the layers m2 and c2, constitute the directional coupler C3 of FIG. 1. Here, the main line 1-1 on the signal layer (m1) and the main line 1-1 on the signal layer (m2) are the same line folded as shown in FIG. 1.

Between those couplers on the m1–c1 layers and m2–c2 layers, a ground layer or a power supply layer is placed and functions to prevent noise between signals, i.e., coupling between the directional couplers C2–C3. By the structure of FIG. 2, the coupling of signals between the couplers, i.e., crosstalk noise becomes smaller, and high-speed data transfer can be realized.

Those couplers are formed as coupling in vertical direction in the cross section. Of course, the couplers may be formed as coupling by lateral arrangement, as in FIG. 3. Here, "lateral" means that a coupler is formed using the same layer. For example, a coupler C2a enclosed by an ellipse consists of a line 1-1a and a line 1-2a, and the folded main line 1-1a forms a coupler C3a in the m2 layer, in combination with a line 1-3a. Similarly, a main line 1-1b for a different signal bit is coupled with a line 1-2b to form a coupler C2b in the m1 layer, and the folded main line 1-1b forms a coupler C3b, in combination with a line 1-3b. In order to reduce quantity of noise caused by coupling between the couplers C2a, C2b, C3a and C3b, a level power supply layer is provided between the layers, and, within the layer, the lines are arranged distantly from the power supply layer. The structure of FIG. 3 has an effect that smaller number of layers are required for forming the couplers, in comparison with FIG. 2.

Figure 3:
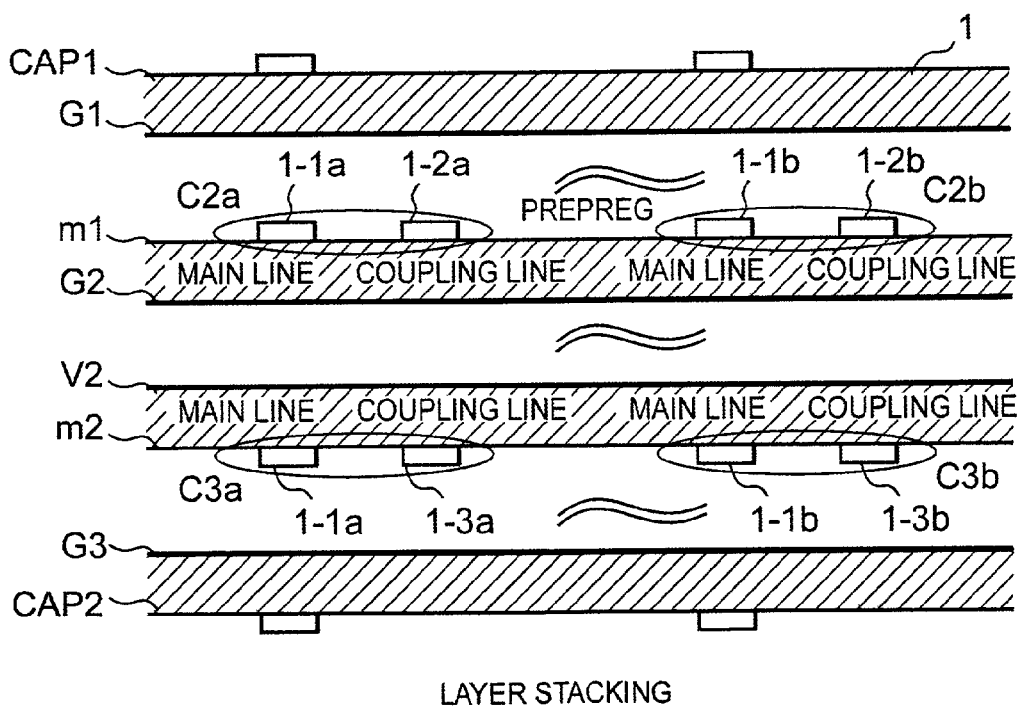
FIG. 3 is a view showing another board structure of the first embodiment.
Figure 4:
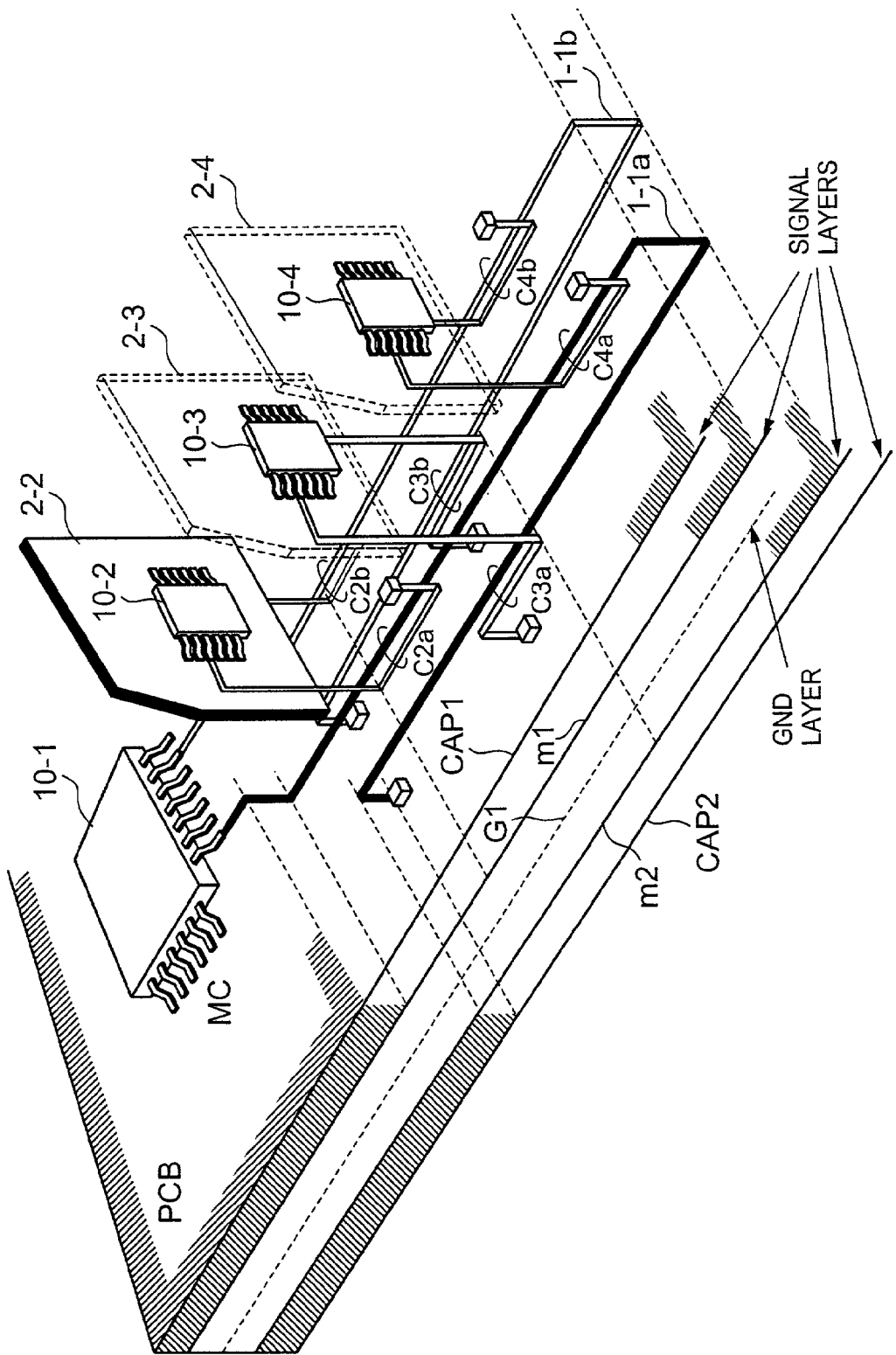
FIG. 4 is a bird's-eye view of the first embodiment.

FIG. 4 is a bird's-eye view of the circuit of FIG. 1 implemented by the packaging of the layer structure of FIG. 3. Reference symbols used in this figure are same as in the previous figures. The main lines 1-1a and 1-1b drawn from MC 10-1 are wired being changed from the CAP1 layer to the m1 layer, and form the couplers C2a, C4a, C2b and C4b in the m1 layer, having a cross section as shown in FIG. 3. Then, changing to the m2 layer, those main lines form the couplers C3a and C3b, and change to the CAP2 layer to be terminated there. Lines from the couplers are connected to the memories 10-2–10-4 mounted on the memory modules 2-2–2-4, respectively. In the example of FIG. 4, only two bits of signals are shown.

Further, it can be easily understood that, by providing two or more folds in FIG. 1 or 4, the intervals between the memory modules 2-2–2-9 can be further shortened without depending on the length of a directional coupler. Namely, when two folds are provided in the main line 1-1, and the directional couplers are formed in different layers, being arranged not to overlap within a same layer, then the modules can be mounted such that a module interval is shortened to about one third of the coupler's length. Similarly, when three folds are provided and the main lines are folded without making the directional couplers overlap, then, the modules can be mounted such that the module interval is shortened to about one fourth of the coupler's length, and a higher degree of mounting density can be realized.

In the present embodiment, the number of memory modules is eight of 2-2–2-9. However, the number can be more or less, depending on the system structure. Further, terminating resistance Rtt may be placed on either an upper surface or lower surface of the mother board 1, since its function is not changed on either surface.

Further, the directional coupler of the present embodiment utilizes backward crosstalk. However, forward crosstalk may be utilized. In the latter case, the direction of signal propagation in the main line 1-1 is opposite to the lines 1-2–1-9. In that case too, by folding the main line, the memory modules can be mounted at pitch smaller than the length of the coupling line.

Figure 6:
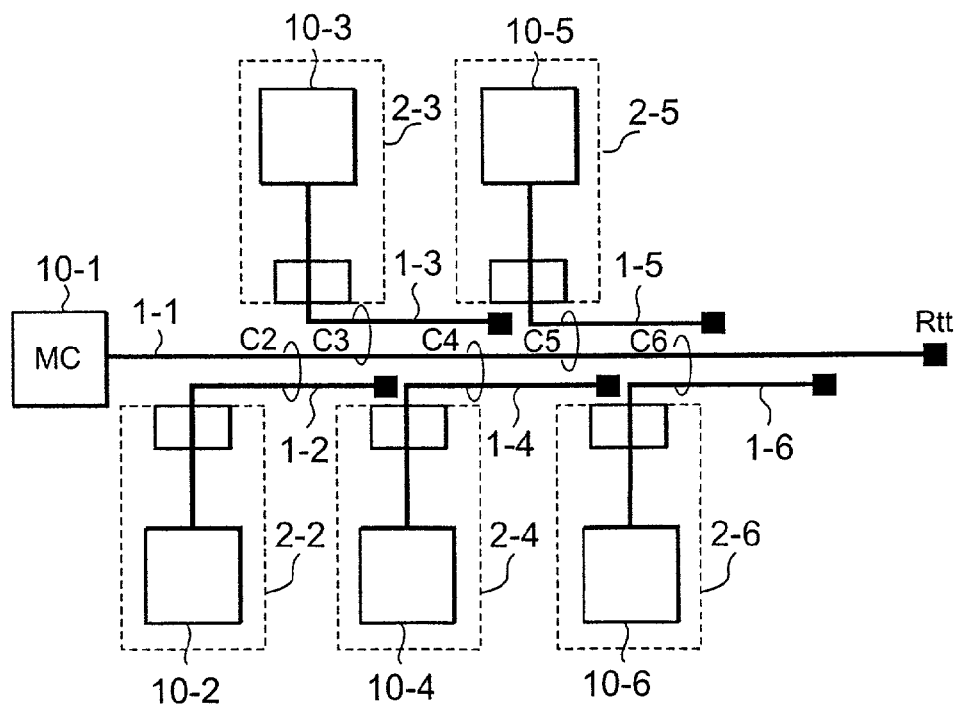
FIG. 6 shows a wiring system for high-density mounting of the memory modules according to a second embodiment.

A second embodiment is shown in FIG. 6. Also, arrangement and wiring in FIG. 6 can realize high-density mounting of memory modules. In FIG. 6, like symbols have like functions as in FIG. 1. FIG. 6 differs from FIG. 1 in construction of directional couplers. Namely, a main line 1-1 is arranged straight, and the directional couplers are located on both the left and right sides of the main line in an alternating way, with the other set of lines 1-2–1-6 of the directional couplers C2–C6 being on the other side.

Figure 7:
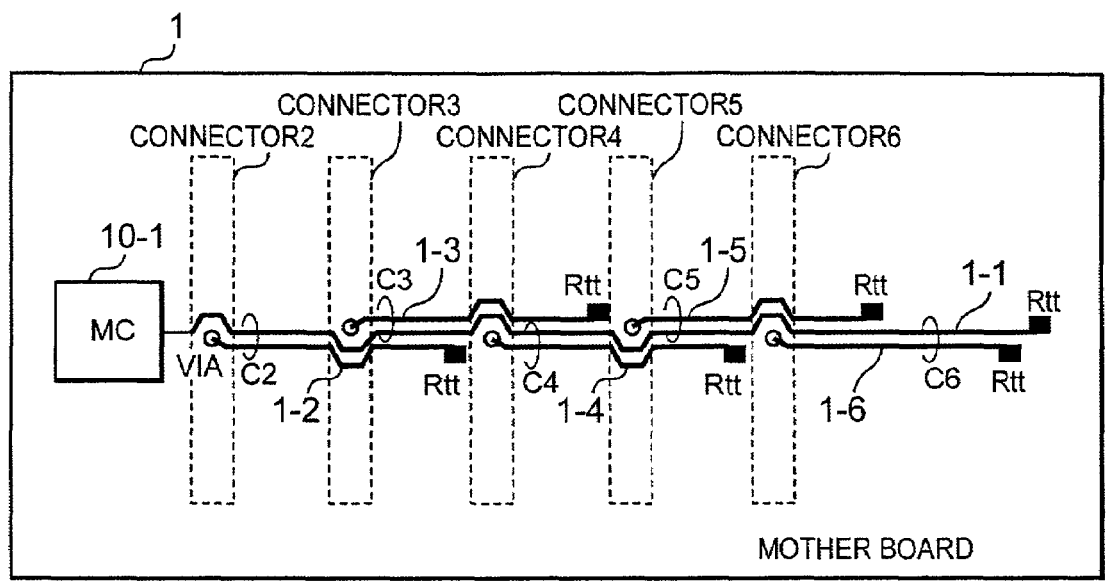
FIG. 7 shows board wiring of the second embodiment.

FIG. 7 shows an example of wiring of the mother board 1 of this FIG. 6. FIG. 7 is a view of the memory system of FIG. 6 seen from the side of the upper surface. The lines shown in FIG. 7 correspond to one bit of data, among the many lines existing in the same signal layer. In the mother board 1, there are arranged MC 10-1 and connectors 2-6 to which the memory modules 2-2–2-6 are to be connected. Data signal in the memory system is connected through a bus, so that one bit of data signal is electrically connected to a signal pin in the same position of each connector. In other words, when attention is paid to a certain signal pin in a connector, each signal line for this signal is drawn from a corresponding pin in each connector and is coupled with the main line 1-1 on the board 1, so that the signal can be transmitted.

In FIG. 7, the main line 1-1 drawn from MC 10-1 is wired toward the termination, and the directional couplers C2–C6 are formed on both sides of the main line 1-1 to bring constant impedance. Between the connectors 3 and 4, the main line 1-1 and the line 1-2 for the coupler C2 extend avoiding VIA for drawing a signal line of the connector 3, and after coupling of the wiring length with the main line 1-1, the line 1-2 is terminated by the terminating resistance Rtt.

Between the connectors 3 and 4, the line 1-2 of the coupler C2 is placed on one side of the main line 1-1, and on the other side, the line 1-3 for the coupler C3 is placed at the same wiring pitch so as to maintain the same degree of coupling. The reason of the same wiring pitch in the arrangement is that degree of coupling should be same for generating signal voltages with the same amplitude both in the couplers C2 and C3, so that modules having the same function can be connected to the connectors 3 and 4. Conversely, by arranging the lines at the same pitch, the main line 1-1 and the lines 1-2 and 1-3 can have each the same crosstalk coefficient, and data from the memory modules mounted on the connectors 3 and 4 can be read and written with the same signal amplitude.

Thus, each pair of the directional couplers C2 and C3, C3 and C4, C4 and C5, and C5 and C6 are formed on both sides of the main line 1-1, with similar wiring arrangement with respect to the other signals, too. As a result, the pitch of the connectors 2-6 can be narrowed to about half in comparison with the wiring length required for each coupler C2–C6. Thus, similar result as FIG. 1 for the first embodiment can be obtained, realizing high-density mounting of memories on the mother board 1.

Here, between the connectors 2 and 3, on only one side of the main line 1-1 has a line 1-2 arranged. In order to prevent mismatch of impedance owing to difference between coupling of two lines between the connectors 2 and 3 and coupling of three lines other than between the connectors 2 and 3, a terminated dummy line may be provided opposite to the side of the line 1-2 from the main line 1-1 between the connectors 2 and 3. As a result, impedance of the main line 1-1 becomes flat, and accordingly, impedance mismatch becomes smaller and signal distortion becomes smaller. Thus, data transfer can be realized at a much higher speed.

Figure 8:
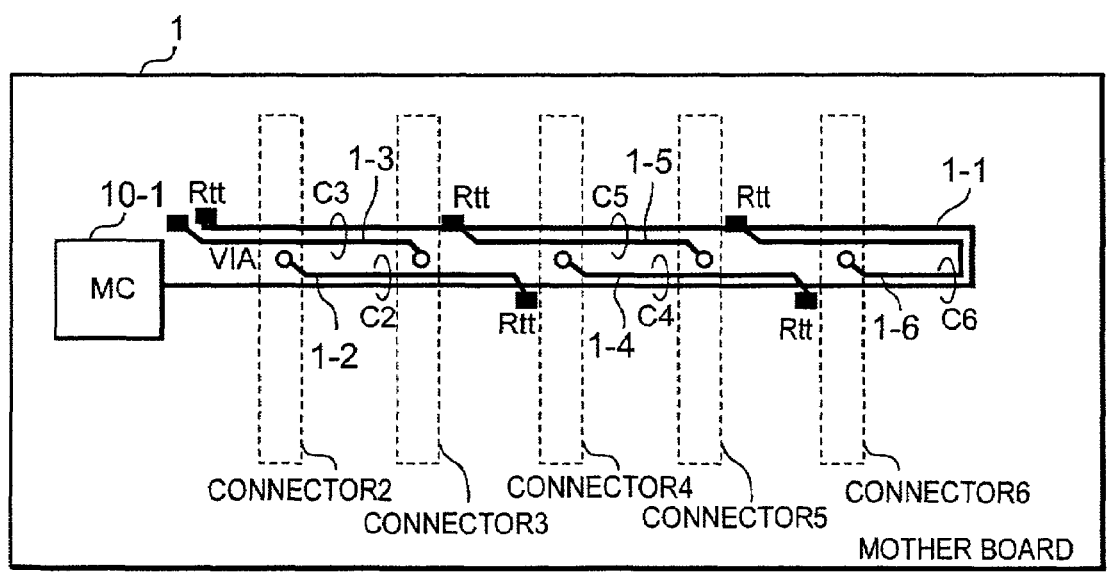
FIG. 8 shows another board wiring of the second embodiment.

A third embodiment is shown in FIG. 8. By folding a main line in a same layer as shown in FIG. 8, high-density mounting of memory modules can be realized.

FIG. 8 has the same structure as FIG. 1 from the electric viewpoint. Similarly to FIG. 7, FIG. 8 is a view of a mother board 1 seen from the side of its upper surface. In FIG. 8, the main line 1-1 from MC 10-1 is folded in a same signal layer within the board (mother board) 1. A signal from MC 10-1 is coupled to signal pins located in the same position in connectors 2-6. The main line 1-1 is wired in the same layer, to enclose those signal pins.

With respect to this main line 1-1, lines 1-2–1-6 from the connectors 2-6 are formed such that couplers C2–C6 correspond to every other connectors arranged successively, being coupled to the main line 1-1 before folding and the main line 1-1 after folding. Of course, the connectors 2-6 and the main line 1-1 are terminated, and there is no reflection distortion at their terminations. Further, the data line (main line) from MC 10-1 is drawn as many lines such as 4 bytes, 8 bytes and 16 bytes depending of the number of data bits. When wiring of the data lines can not be implemented in only one layer in the mother board 1 owing to too high wiring density, the main lines 1-1 may be wired in respective different layers, depending on a plurality of signals. For example, when it is assumed that the main line 1-1 of FIG. 8 corresponds to data of even order, then use another signal layer for signals of odd order can reduce wiring density by half. Similarly, by assigning signal layers according to modulo-3 residue of the number of a signal, wiring density in a same layer can be reduced to one third.

Further, as another effect, by wiring the main line 1-1 in a same wiring layer, it is not necessary to use VIA at a fold, in contrast with FIG. 1, and disturbance of impedance scarcely exists. Thus, the characteristic impedance of the main line 1-1 becomes constant. By this, signal reflection at VIA becomes smaller and waveform distortion becomes smaller, so that data transfer at a much higher speed can be realized.

Next, referring to FIG. 9, a fourth embodiment will be described.

The present embodiment relates to a memory module that can be applied to the first embodiment or both the second and third embodiments.

Figure 9A:
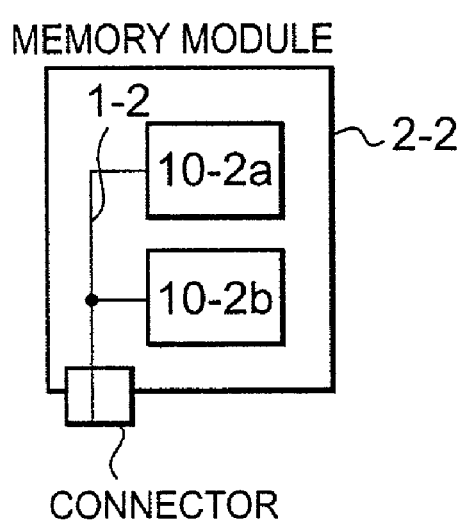
FIG. 9 shows a memory module.
Figure 9B:
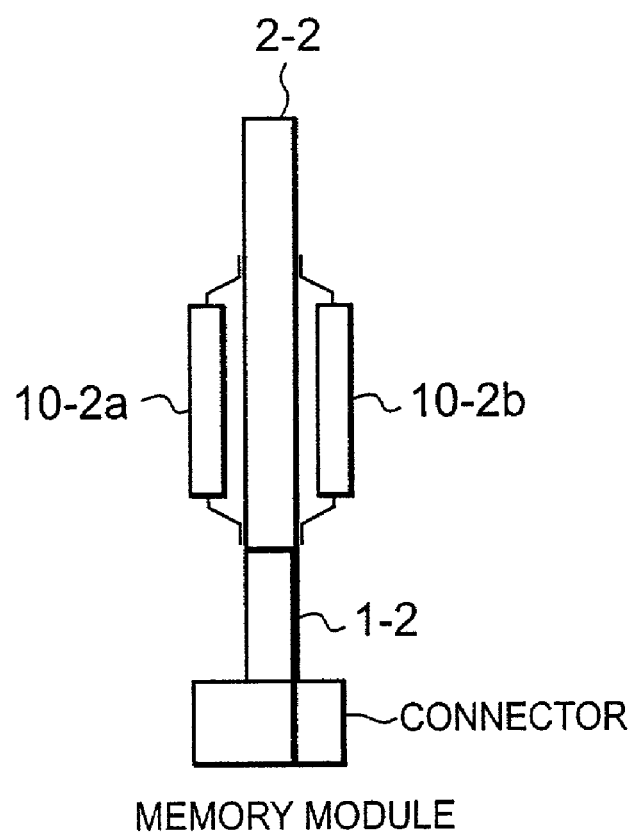

FIG. 9($a$) shows a signal connection diagram within a memory module 2-2. In the memory module 2-2 shown in FIG. 9($a$), two memory chips 10-2$a$ and 10-2$b$ are connected to one signal line 1-2, so that memory capacity per module can be increased twice. FIG. 9($b$) is a cross section of a board of the module 2-2. The memory chips 10-2$a$ and 10-2$b$ are arranged on both sides of the board of the module 2-2. In order to connect same signal pins with each other at the shortest distance, VIA for a signal is provided in the end of the line 1-2, and used for connecting the chips 10-2$a$ and 10-2$b$. By arranging and wiring as shown in FIG. 9($b$), the memory chips 10-2$a$ and 10-2$b$ connected to the line 1-2 are connected with each other at the shortest distance, and accordingly, it is possible to make input or output waveforms almost same on those chips. Accordingly, capacity of mounted memory per module can be increased twice, and as a result, memory can be mounted at high density as the whole system.

Figure 10:
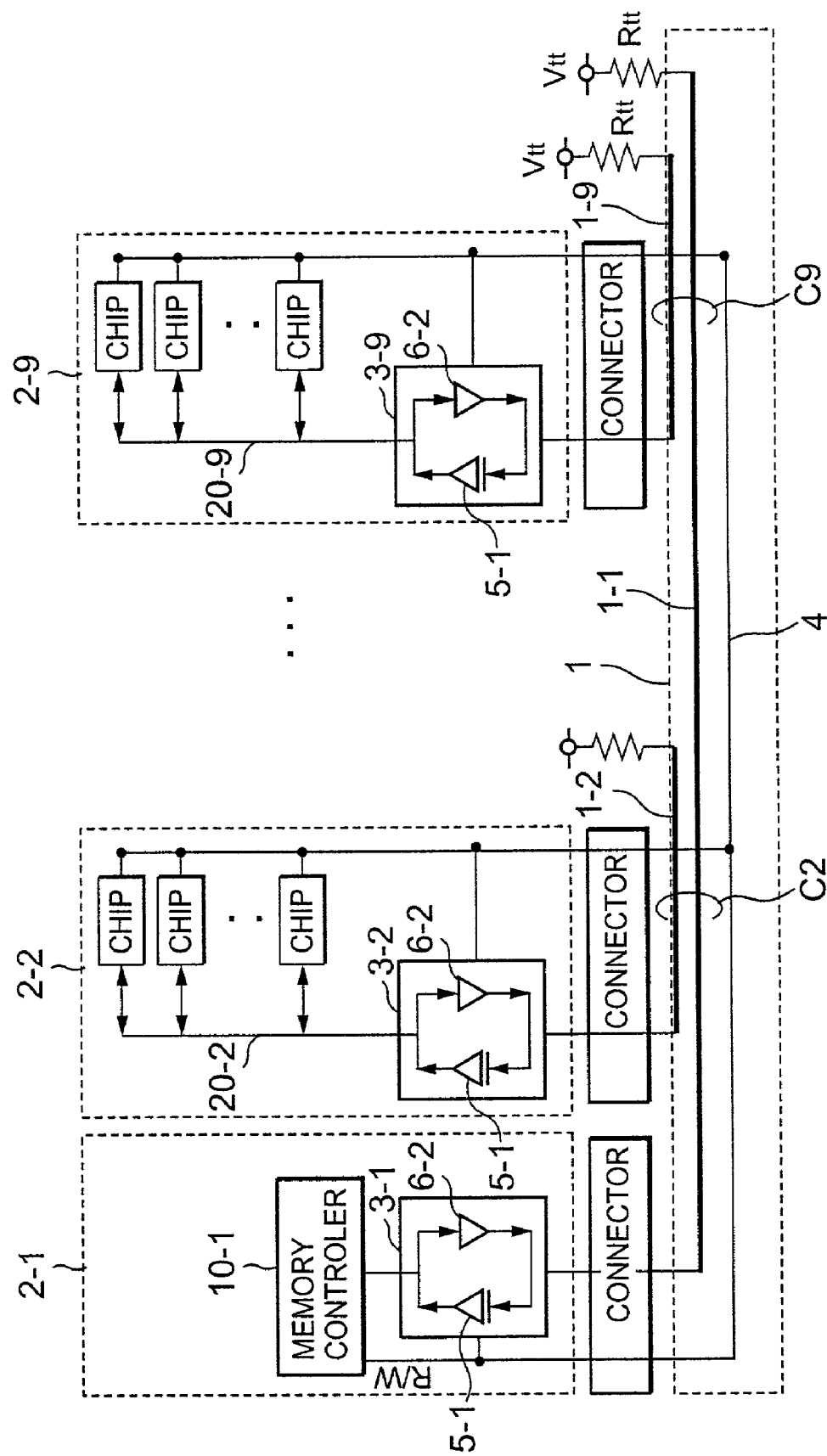
FIG. 10 shows a memory system using directional coupling transmission transceivers.

Next, a fifth embodiment will be described referring to FIG. 10.

In the present embodiment, a transceiver of a directional coupler is provided as a separate part, so that capacity of a mounted memory module can be increased further.

Transceivers 3-1–3-9 each comprise a driver 6-2 and a receiver 5-1, and have a directional control function for output control of the driver 6-2 and the receiver 5-1. In FIG. 10, the driver 6-2 is shown by a triangle and the receiver 5-1 connected to a directional coupler is shown by a triangle having the base of a double line. The driver 6-2 receives an NRZ (Non Return to Zero) signal that is an ordinary digital signal (a rectangular pulse) as input, and outputs this signal as the NRZ signal. A signal converted from an NRZ signal to an RTZ (Return to Zero) signal can be demodulated by the receiver into the original NRZ signal. Namely, the receiver converts an RTZ signal into an NRZ signal.

The module 2-1 comprises a memory controller 10-1 and a transceiver 3-1. Each of the memory modules 2-2–2-9 is mounted with a plurality of memory chips, and these memory modules 2-1–2-9 are arranged on a mother board 1 through connectors.

A main line 1-1 is terminated at the other end, for impedance matching, being connected to a terminating voltage Vtt. In the directional couplers C2–C9, lines drawn from the transceivers 3-2–3-9 within the memory modules 2-2–2-9 and the main line 1-1 constitute the couplers. Similarly to the main line 1-1, these lines are terminated for impedance matching, being connected to the terminating voltage Vtt. The main line 1-1 may be folded as shown in FIGS. 1, 7 or 8, to constitute parallel couplers.

MC 10-1 sends the transceivers 3-1–3-9 a read/write (R/W) signal 4 for controlling the signal transfer direction, depending on a state of memory read or memory write. The signal 4 may also serve as a read/write signal for the memory chips. In FIG. 10, the read/write signal is connected to all the chips. However, in the case that the fan-out of the driver of MC 10-1 is large in comparison with the R/W signal's operation frequency, a transceiver may be added in order to decrease the fan-out. Since the transceiver's operation frequency is low, data transfer between transceivers can be performed as transfer from NRZ to NRZ.

Next, write operation, in which data is written from MC 10-1 of FIG. 10, will be described.

First, MC 10-1 sets the R/W signal into a write mode, enables the buffer 6-2 within the transceiver 3-1, and disables the buffer 5-1. Conversely, MC 10-1 disables the buffers 6-2 built in the transceivers 3-2–3-9 within the memory modules 2-2–2-9, and enables the buffers 5-1. This prepares for writing from MC 10-1 to each memory.

After bank RAS (Row Address Strobe)/CAS (Column Address Strobe) address is sent to prepare for the writing, MC 10-1 sends digital (NRZ) data. The sent NRZ signal is converted to an RTZ signal in the couplers C2–C9, and transmitted to the transceivers 3-2–3-9 within the memory modules 2-2–2-9. The transmitted RTZ signal is demodulated from the RTZ signal to the NTZ signal in the respective buffers 5-1 within the transceivers 3-2–3-9, and the data is transferred to the memory chip through the buses 20-2–20-9. This data is written into the memory, to complete the write operation.

Next, read operation, in which data is read into MC 10-1, will be described.

First, MC 10-1 sets the R/W signal into a read mode, enables the buffer 5-1 within the transceiver 3-1, and disables the buffer 6-2. Conversely, MC 10-1 disables the buffers 5-1 built in the transceivers 3-2–3-9 within the memory modules 2-2–2-9, and enables the buffer 6-2. This operation prepares for reading from each memory to MC 10-1.

After sending bank RAS/CAS address to prepare for the reading, the addressed memory sends digital (NRZ) data. The transmitted NRZ signal is sent as the NRZ signal itself through the buffer 6-2 within the transceiver 3-2–3-9 respectively, converted into an RTZ signal in the coupler C2–C9, and propagated to the main line 1-1. The transmitted RTZ signal is demodulated from the RTZ signal to the NRZ signal in the buffer 5-1 within the transceiver 3-1, and the data is transmitted to MC 10-1. When MC 10-1 reads this data, the read operation is completed. Here, of course, the address and the read/write state are determined previous to the time of the read/write operation.

Thus, since the transceiver 3-1 provided within the memory controller module is combined with the directional couplers C2–C9, data can be transferred with low distortion and at a high speed. Accordingly, MC 10-1 can send and receive all the signals in the NRZ form at a high speed. As a result, it is not necessary to provide the receiver with a special circuit for demodulating an RTZ signal, and it is possible to connect a memory controller that has only a driver receiver for transfer of an NRZ signal. Further, since the memory controller is provided in the form of a module, it is also possible to connect a memory controller provided with an RTZ receiver that can be directly connected to the main line 1-1. As a result, the system structure becomes flexible.

Thus, by combining the transceivers 3-2–3-9 provided within the memory modules with the directional couplers C2–C9, data transfer to and from MC 10-1 can be realized with low distortion and at a high speed. such structure has the effect that a memory chip can have an interface only for a conventional NRZ signal, and cheap chips can be connected. Further, the data bus inside the memory module 2-2 is generally shorter in comparison with the main line 1-1, so that high-speed operation can be realized similarly to the bus using the directional couplers for memory modules. As a result, from the viewpoint of the system, many memory chips can be mounted in a memory modules, and accordingly, the high-density memory system can be realized.

Figure 11:
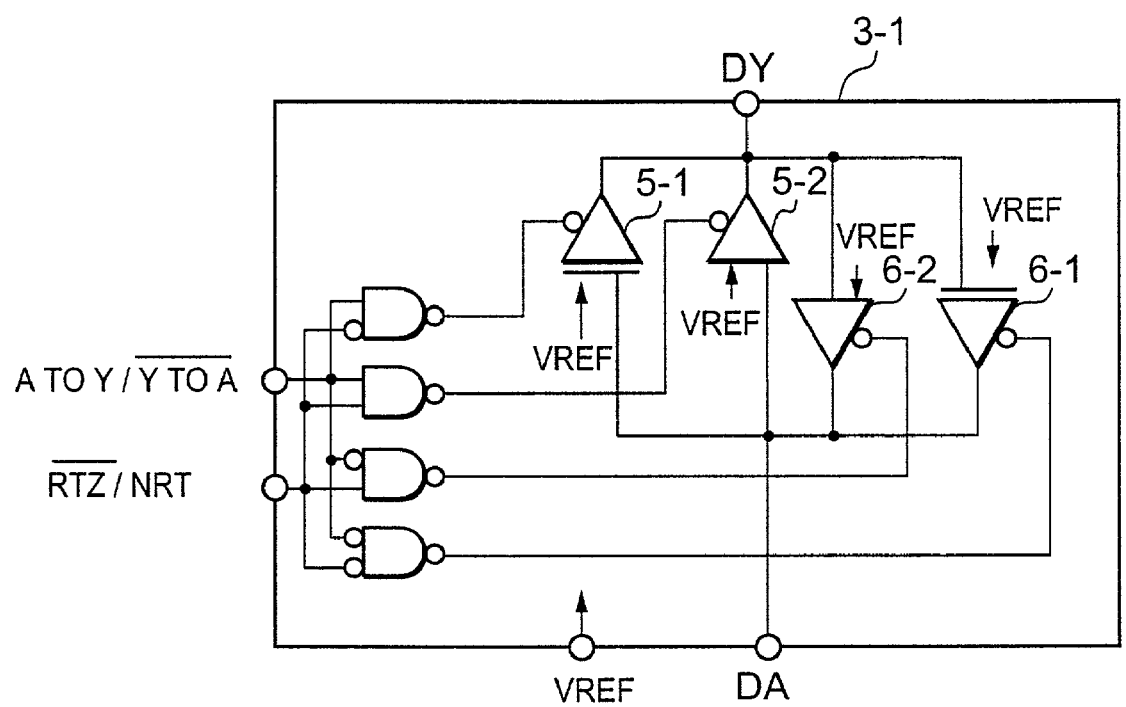
FIG. 11 shows inside structure of a directional coupling transmission transceiver.

Referring to FIG. 11, the structure of the tranceiver will be described.

The transceiver 3-1 has two signal pins for data input and output, being referred to as DA and DY, respectively. Buffers 5-1, 5-2, 6-1 and 6-2 are provided within the transceiver 3-1, and connected in parallel, to constitute a transceiver circuit. The buffers 5-1 and 6-1 have a function of demodulating an RTZ signal to an NRZ signal. The buffers 5-2 and 6-2 within the transceiver receives an NRZ signal as an input and outputs an NRZ signal.

All the buffers 5-1, 5-2, 6-1, and 6-2 operate exclusively, and only one of them is selected in order to select a transmission direction and a signal conversion type.

For example, in order to transfer data from data DY to DA, a directional control signal, i.e., AtoY signal is set H, and the buffer 5-1 or 5-2 is enabled. For selection of the buffer 5-1 or 5-2, an RTZ signal is used. In order to transfer data from data DA to DY, AtoY signal is set L and the buffer 6-1 or 6-2 is enabled. For selection of the buffer 6-1 or 6-2, an RTZ signal is used.

Further, Vref is a reference voltage for input signals into the buffers 5-1, 5-2, 6-1 and 6-2, and each reference voltage is connected to a terminal shown by an arrow. Using this reference voltage, an input signal is judged.

According to the structure of FIG. 11, DA and DY signals become symmetrical with respect a data transfer direction, and data transfer can be carried out from either an RTZ signal or an NRZ signal. In FIG. 11, the four buffers 5-1, 5-2, 6-1 and 6-2 are connected in parallel. However, it is possible to employ structure in which only two buffers, i.e., the buffer 5-1 for an RTZ signal and the buffer 6-2 for an NRZ signal are connected in parallel. In such a case too, the functions of the transceivers 3-1–3-9 shown in FIG. 10 can be realized. This is because, both in the write and read operations in FIG. 10, data transfer can be carried out by the following operation. Namely, when a signal is sent form MC 10-1 or from the side of the chips, the buffer 6-2 for an NRZ signal is selected, and when an RTZ signal from the mother board 1 is received, the buffer 5-1 for an RTZ signal is selected.

As described above, there is a problem that in high-speed data transfer, as the transfer speed increases, waveform distortion increases owing to the frequency-dependent effects such as the skin effect. As a technique for overcoming this problem, there is a technique in which pulse waveform is sharpened at the transition (rise and fall) times. However, this technique is complex in the structure and control of the driver. Thus, an object of the present embodiment is to perform such shaping of the pulse waveform using not a driver but a coupler.

Figure 16:
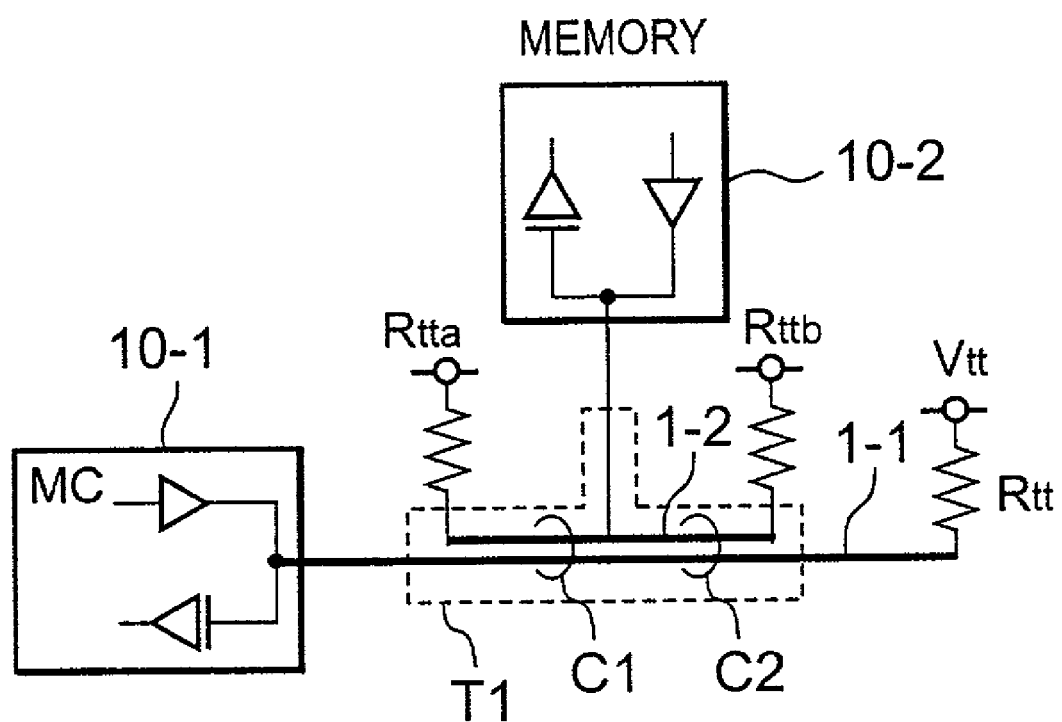
FIG. 16 shows a memory system using a T-shaped coupler.

FIG. 16 shows a memory bus using a T-shaped coupler for attaining the above object, and the principle of this T-shaped coupler will be described referring to FIGS. 12 and 13.

FIG. 16 is a view showing application of the T-shaped coupler to a memory bus system, and a memory controller 10-1 and a memory chip 10-2 are connected to the T-shaped coupler. Each of the controller 10-1 and the memory 10-2 has an interface circuit comprising a driver and a receiver for data sending and receiving. Namely, this interface circuit comprises an NRZ signal driver and an RTZ signal receiver.

In FIG. 16, the T-shaped coupler T1 comprises couplers C1 and C2 coupled to a main line 1-1 that is terminated at its one end and a leader line that is terminated at its both ends by terminating resistance Rtta and Rttb, respectively. In the present embodiment, the couplers C1 and C2 have each the same coupling line length.

Figure 12:
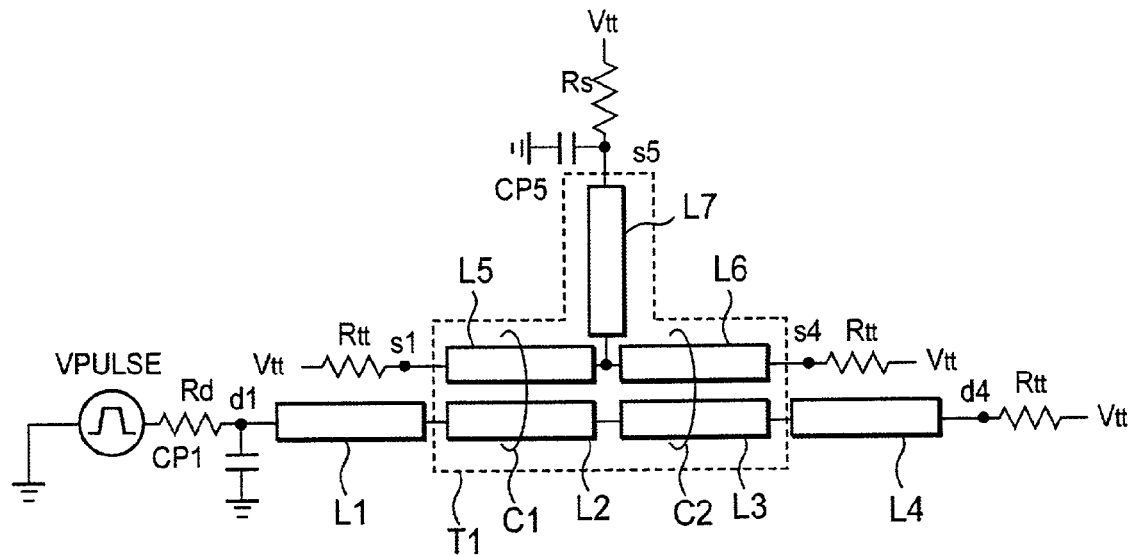
FIG. 12 shows an equivalent circuit for a T-shaped coupler etc. (in write operation)
Figure 13:
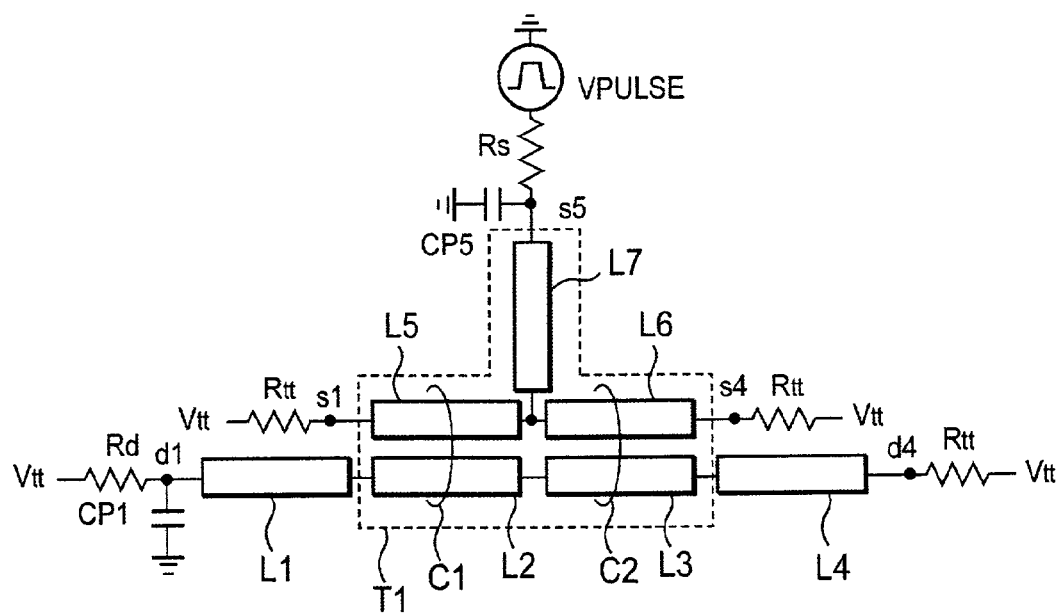
FIG. 13 shows an equivalent circuit for the T-shaped coupler etc. (in read operation)

FIG. 12 is an explanatory view for memory write operation by the T-shaped coupler shown in FIG. 16, and FIG. 13 is an explanatory view for read operation.

Empty boxes shown in FIGS. 12 and 13 express transmission paths. A line corresponding to the main line 1-1 comprises transmission lines L1, L2, L3 and L4, and a line corresponding to the line 1-2 in FIG. 16 comprises transmission lines L5, L6 and L7. The transmission lines L2 and L5 form the coupler C1, and the transmission lines L3 and L6 form the coupler C2.

In the present embodiment, a part comprising the two couplers C1 and C2, and the transmission line L7 as a leader line for those couplers is referred to as T-shaped coupler T1 shown in a dotted line.

Each terminal of the coupler T1 is connected to the terminating voltage Vtt through a terminating resistance Rtt, in order to clarify the naked (true) electric characteristics of the coupler. By this, there is no reflection at each point in the transmission path.

In write operation shown in FIG. 12, the driver of MC 10-1 in FIG. 16 is expressed by an equivalent circuit comprising a pulse source (vpulse), its internal resistance rd, and capacitance Cp1 of MC 10-1, in FIG. 12. Further, the receiver of the memory 10-2 in FIG. 16 is expressed by capacitance Cp5 and resistance rs connected to the node s5, in FIG. 12. Further, in read operation, the receiver of MC 10-1 is expressed by the capacitance Cp1 and resistance rd connected to a node d1 in FIG. 13, and the driver of the memory 10-2 is expressed by a pulse source, its internal resistance rs, and equivalent capacitance Cp5.

Circuit simulation was carried out in order to clarify the characteristics of this T-shaped coupler.

Figure 14:
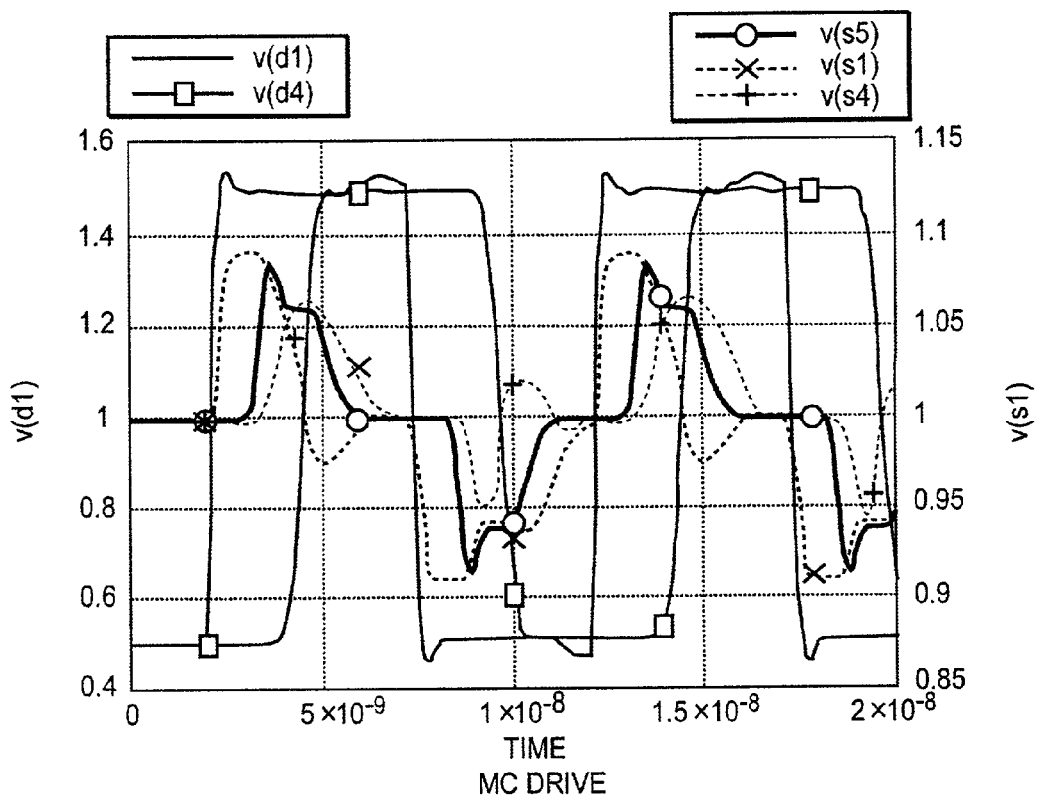
FIG. 14 shows simulation waveforms (in write operation)
Figure 15:
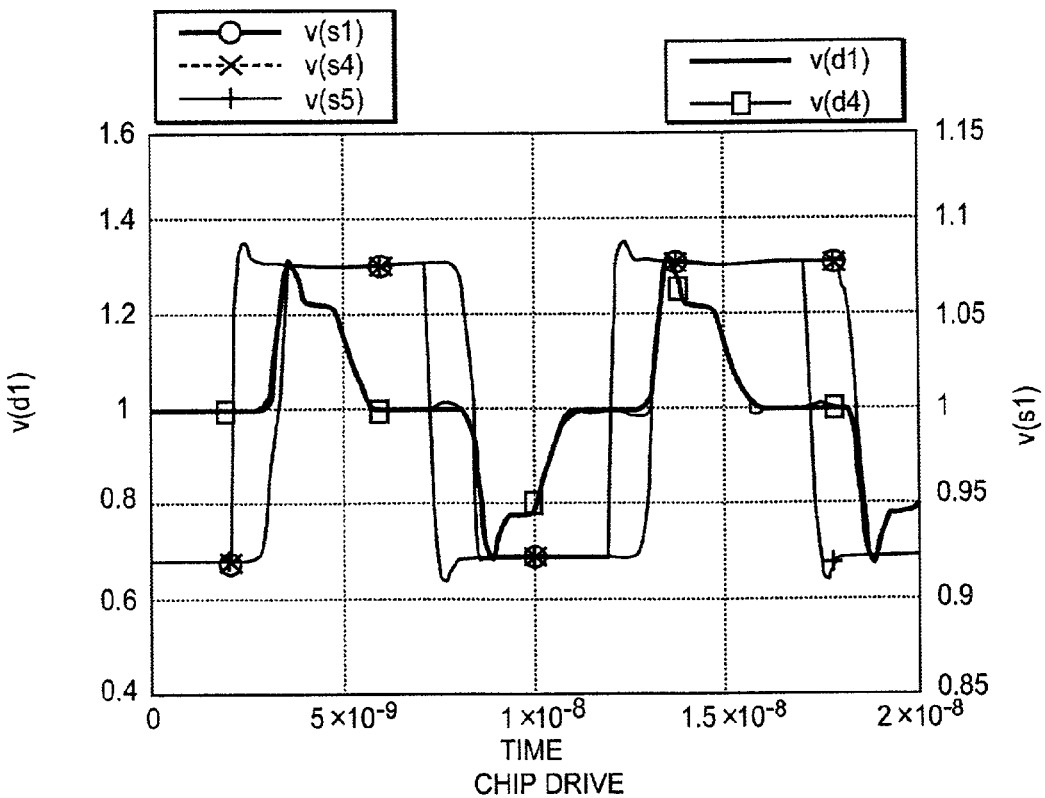
FIG. 15 shows simulation waveforms (in read operation)

Waveforms for various points are shown in FIGS. 14 and 15.

The circuit simulation was carried out using SPICE (Simulation Program for Integrated Circuit Emphasis). However, SPICE employed can not deal with the skin effect, and accordingly, a waveform without the skin effects, namely, a state without dull waveform was simulated. In fact, the skin effect is superimposed on this simulation effect. As a result, generally, shoulders of the waveform become attenuated or dull.

FIG. 14 shows waveforms at various points (d1, d4, s1, s4 and s5) in the read operation corresponding to FIG. 12, and FIG. 15 shows waveforms at those points (d1, d4, s1, s4 and s5) in the write operation corresponding to FIG. 13. FIG. 14 and FIG. 15 are different from each other only in driving position, and the other constants of the circuit are same.

In FIG. 14, the driving position is the node (point) d1 in FIG. 12. Observation points for waveforms are the driving point d1, the termination point d4 of the main line 1-1, the input terminal s5 of rs, and both terminations s1 and s4 of the coupler.

The parameters have the values shown in the following.
Terminating resistance rtt=50 [Ω]
Capacitance of equivalent input c1=3 [pF]
Capacitance of equivalent input c5=3 [pF]
Terminating supply voltage vtt=1.0 [V]
Internal impedance at the point s5 rs=50 [Ω]
Internal impedance of vpulse rd=50 [Ω]
Transition time tr=0.2 [ns]
Propagation delay for the leader line (L1) of the main line 1-1
  tpd1=216 [ps]
Propagation delay for the leader line (L4) of the main line 1-1
  tpd2=360 [ps]
Propagation delay for the leader line (L7) for the T-shaped line 1-2
  tpd5=216 [ps]
Impedance of the line (L1) of the main line 1-1
  z1=50 [Ω]
Impedance of the line (L2) of the main line 1-1
  z2=50 [Ω]
Impedance of the leader line (L7) of the T-shaped line 1-2
  z5=25 [Ω]

The model parameters of the couplers (coupler 1 and coupler 2) are shown in the following.
  r11=1m [Ω/m] L11=361.3n [H/m]
  r22=1m [W/m] L22=361.3n [H/m] L12= 050n [H/m]
  cr1=144.5p [F/m]
  cr2=144.5p [F/m]
  c12=40 p [F/m]

Here, r11 and r22 are line resistances per unit length, L11 and L22 self-inductances per unit length of the lines, CR1 and CR2 self-capacitances per unit length of the lines, and L12 and C12 respectively mutual inductance and mutual capacitance per unit length of the lines.

In FIG. 14, the node d1 shows transmission signal waveform, the node d4 waveform at the position of the terminating resistance of the main line 1-1, and s1, s4 and s5 waveforms at various points in the lines on the other side of the T-shaped coupler. In FIG. 14, a received waveform is shown as the waveform of a heavy solid line of s5, seen as a sharp waveform that becomes steeper at the transition times. By this, it is seen that attenuation at shoulders of signal waveform owing to the skin effect etc. can be equalized.

Similarly, FIG. 15 shows waveforms corresponding to FIG. 13. Transmission waveform from the node s5 is a rectangular waveform, and waveform at the receiving node d1 shows a sharp waveform steeper at the transition time, similarly to FIG. 14. This shows that attenuation at shoulders of signal waveform owing to the skin effect etc. can be equalized.

Next, the reason that waveform can be sharpened will be described referring to FIGS. 18 and 19.

FIG. 18(1) shows write data waveform, i.e., an NRZ signal waveform from vpulse of FIG. 12 or from MC 10-1 of FIG. 16. It is assumed that this signal propagates through the main line 1-1, and after elapse of time T1, arrives at a position on the main line 1-1 corresponding to a junction (a branch point) between the couplers C1 and C2. A signal generated in this coupler C1 at this time becomes waveform of FIG. 18(2). This waveform is generated as forward crosstalk (FWXT) in the case that the coupler C1 is micro strip line (MSL). This has pulse width comparable to a rise time (Ta) of the output waveform of MC 10-1. This FWXT has a property of running alongside a pulse that propagates through the main line 1-1, and is generated as crosstalk at a junction between the transmission lines L5 and L6 as a branch point in the line 1-2, just when the pulse arrives at a junction between the transmission lines L2 and L3 on the main line 1-1. Here, in the case that the coupler is strip line (SL), the coupling coefficient is zero, and accordingly forward crosstalk (FWXT) is not generated.

Further, the NRZ signal on the main line 1-1 propagates without reflection on the transmission line L3 toward the termination. This propagation pulse generates backward crosstalk (BWXT) in the coupler C2. This crosstalk waveform is shown in FIG. 18(3). This crosstalk waveform of FIG. 18(3) endures for duration of round-trip propagation in the line length of the coupler C2.

For example, in the case that the coupler is formed in a glass epoxy type printed circuit board, its relative dielectric constant is about $\epsilon r=4.6$. Thus, in the case that the coupling length is 30 [mm], multiplication by the propagation velocity 7.15 [ps/mm] ($=\sqrt{\text{relative dielectric constant}=4.6}$/velocity of light) of the pulse leads to a round-trip propagation delay 429 [ps].

In the coupler T1 shown in FIG. 12, the forward crosstalk generated in the coupler C1 and the backward crosstalk generated in the coupler C2 are superimposed. This waveform is shown in FIG. 18(4), and propagates to the memory chip 10-2 of FIG. 16.

The skin effect is a phenomenon that shoulders of waveform become dull, and by causing overshoot of the rise of the pulse, this dulling of waveform can be eliminated. The waveform of FIG. 18(4) is just like that.

FIG. 18 shows waveforms relating to the data transfer from MC 10-1 to the chip 10-2 in FIG. 16. Similarly, the same waveforms are generated with respect to data transfer from the chip 10-2 to MC 10-1. This will be described referring to FIG. 19.

FIG. 19(1) shows an NRZ signal from the chip 10-2. After this signal arrives at the branch point in the line 1-2, it proceeds both toward the coupler C1 (L5) and toward the coupler C2 (L6). Thereafter, the waveform generation process shown in FIG. 18 occurs in the reverse direction. FIG. 19(2) shows voltage waveform at d1 in FIG. 15 on the side of MC 10-1. Here, FWXT is generated in the coupler C1, runs alongside a pulse waveform that transmits through the transmission line L5, and proceeds through the transmission line L2 while increasing the pulse amplitude. On the other hand, BWXT generated in the coupler C2 is generated at the same time when the pulse is inputted into the branch point of the line 1-2, and the generated BWXT proceeds through the transmission line L2. This pulse width is Tb that is same as the time shown in FIG. 18. These forward crosstalk generated in the coupler C1 and the backward crosstalk generated in the coupler C2 proceed through the transmission line L2 at the same time, and result in the waveform shown in FIG. 19(2). This is same as the waveform of FIG. 18(4) in the case of the drive by MC 10-1. On the other hand, the waveform on the side of d4 of FIG. 13 becomes the waveform shown in FIG. 19(3). This is the same waveform as FIG. 19(2) except for its arrival time. This is because, although BWXT and FWXT generated in the main line 1-1 are generated respectively in the couplers C2 and C1, in opposition to MC 10-1, they are generated in the same generation process.

As described above, when the T-shaped coupler is used, although an edge rises sharply (overshoot) only at a transition time, the pulse width is the same as the case in which only the coupler C2 is used, without increasing the pulse width. In other words, also the T-shaped coupler can be used to equalize dull waveform owing to the skin effect, and at the same time, can maintain the same pulse width as in the case of using the coupler C2 only, so that the high-speed operation is not retarded.

The overshoot part is generated by FWXT, and accordingly, micro strip line should be selected for the coupler. Further, even in FWXT, its forward crosstalk coefficient may be positive or negative depending on the structure of the board. Thus, it is important to select the wiring structure in the board such that the forward crosstalk coefficient becomes positive.

Owing to thus-described operation, in the memory system of FIG. 16, dulling of waveform caused by the skin effect can be equalized by the overshoot generated in the T-shaped coupler T1–T3, between MC 10-1 and the memory chips 10-2–10-4, so that operation at much higher speed can be realized.

Next, a memory system using this T-shaped coupler line will be described referring to FIG. 17. An object of the present embodiment is to simplify data fetch timing design that is indispensable for high-speed data transfer, in addition to high-density mounting of memory according to the first embodiment.

A memory controller (MC) shown as 10-1 sends and receives a read signal, a write signal, and a clock signal to and from memory chips 10-2–10-7. The reference numeral 7-1 refers to a main line for the clock signal, and 7-2–7-7 to T-shaped couplers coupled with the main line 7-1. Those couplers are connected to the memory chips 10-2–10-7, respectively.

The clock signal CLKout is outputted from MC 10-1 synchronously with a clock phase φ within the MC 10-1, passes through the main line 7-1, and is inputted again to a clock input signal CLKin. The main line 7-1 is terminated at both ends in the neighborhood of MC 10-1, and there hardly exist any reflection at those ends.

Read and write signal terminals of a switch 9 are connected to a main line 8-1 for data. The switch 9 is connected to Write direction at the time of write operation and to Read direction at the time of read operation, with low impedance. The main line 8-1 for data and the couplers 8-2–8-7 are wired in the same wiring positions (in the same shape) as the line 7-1 for the clock and the couplers 7-2–7-7. Propagation delay of the switch 9 has a finite value, and a line having the same propagation delay as that value is added to the line 7-1 for the clock signal CLKout so as to realize the wiring of the same shape seen from MC 10-1.

Figure 17:
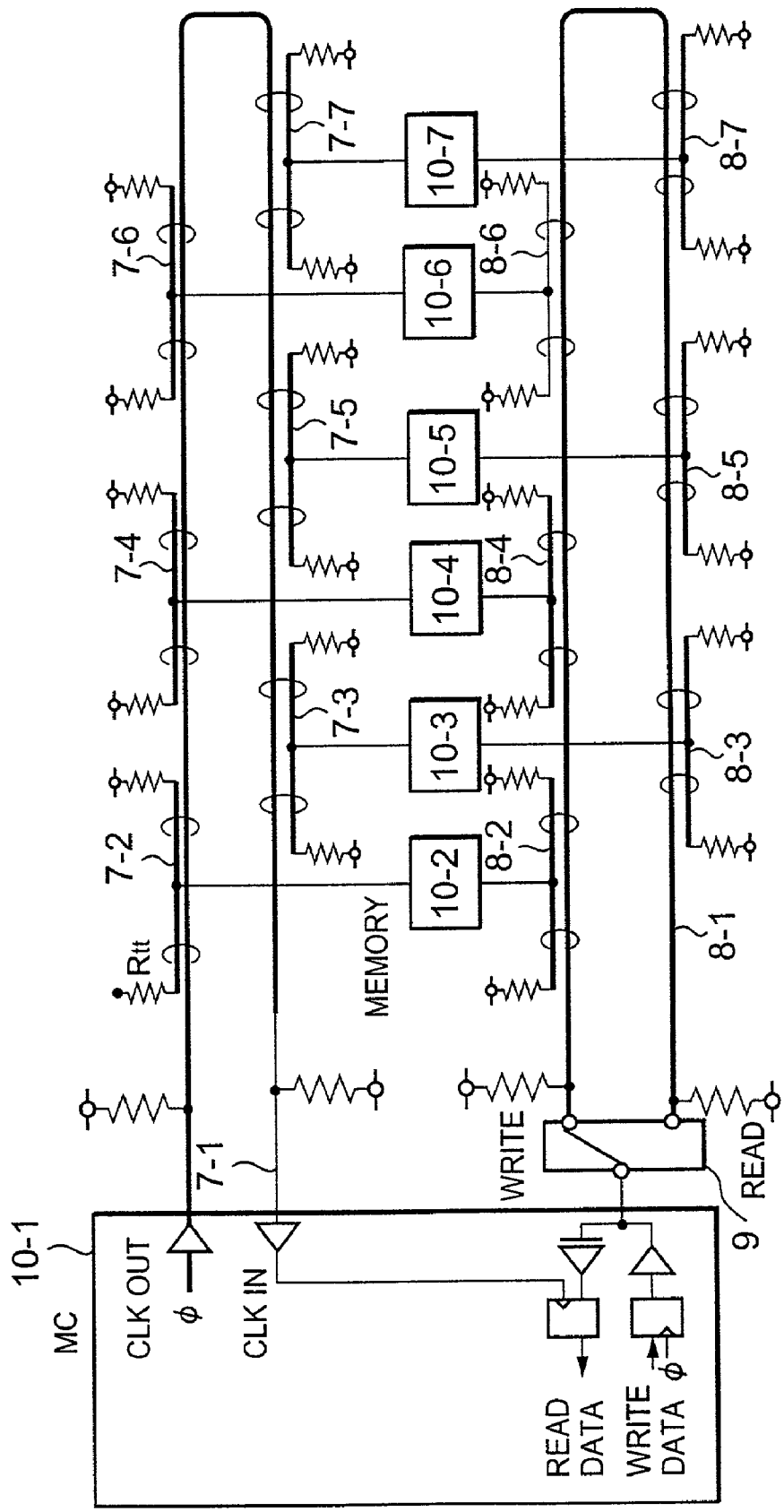
FIG. 17 shows a memory system using a return clock and the T-shaped couplers.

Here, FIG. 17 shows only the CLK signal and data signal. For other signals, for example one-way signal that are only written into the chips, such as an address signal, a control signal, a chip select signal, etc., a switching device such as the switch 9 is not necessary.

Figure 29:
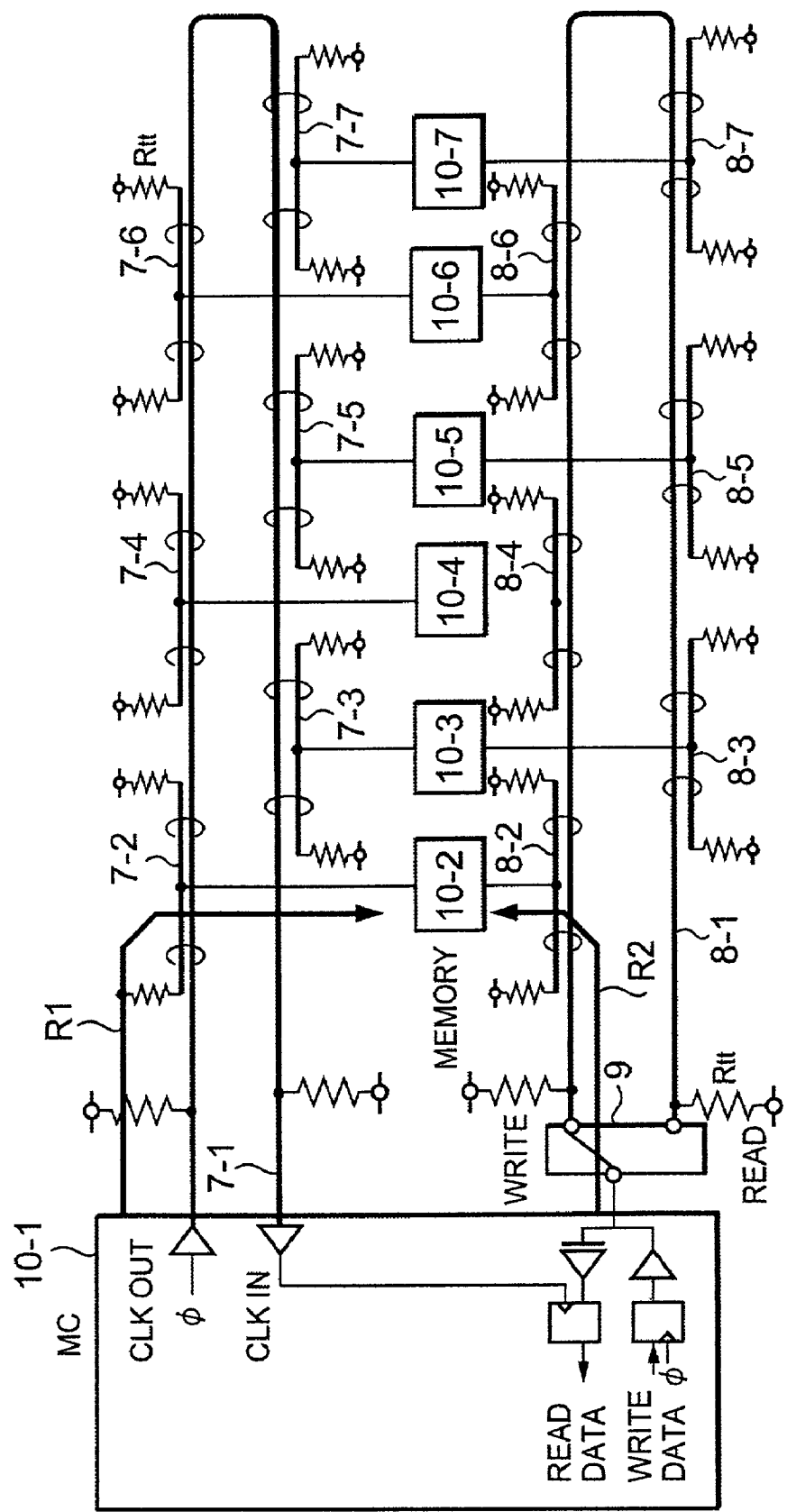
FIG. 29 is an explanatory view for a write operation in a memory system.

Referring to FIG. 29, a case in which data is written from MC 10-1 (write operation) will be described. The reference numerals and their meanings are same as FIG. 17.

First, MC 10-1 controls the switch 9 to switch it to Write side, previously to writing to the memory. After sending bank RAS/CAS address to prepare for writing, MC 10-1 sends NRZ write data synchronously with the clock CLKout.

For example, when write operation for the memory 10-2 is carried out, the sent clock signal (CLKout) and the NRZ signal of the write data are converted to RTZ signals in respective T-shaped couplers 7-2 and 8-2.

The clock signal CLKout arrives at the memory 10-2 through a path R1 in which the signal propagates through the lines 7-1 and 7-2. The write data arrives at the memory 10-2 through a path R2 in which the signal propagates through the lines 8-1 and 8-2. The paths R1 and R2 are equal-length lines when the switch 9 is included. As a result, the clock signal and the data signal arrive in phase at the memory 10-2. Here, "phases" means a phase of signal waveform for the clock signal and the data signal, and "in phase" means that a phase difference is so small that it can be neglected in the read/write operation.

Similarly, with respect to the other memories 10-3–10-7, phase differences between the clock signal and the write data signal are same owing to the same-shape wiring, although there are differences in propagation delays from MC 10-1. In other words, since a phase difference between the clock signal and the write data signal is same for every memory chip 10-2–10-7, the memories 10-2–10-7 can take in (latch) data using the clock signal CLKout. Thus, with respect to each memory, the clock signal CLKout and the write data having the same phase difference can be transmitted.

Figure 30:
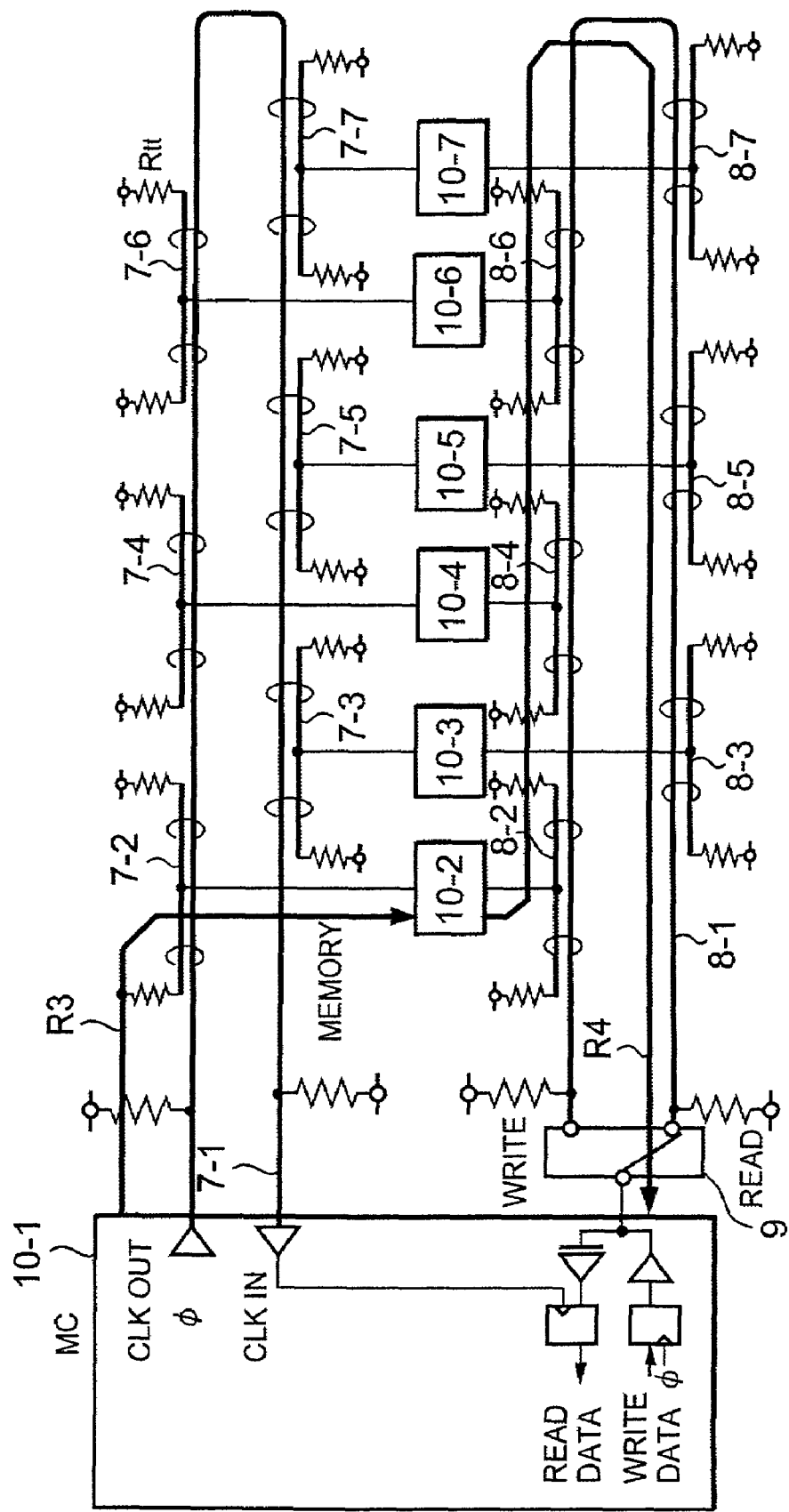
FIG. 30 is an explanatory view for a read operation in the memory system.

Next, referring to FIG. 30, operation in the case that data is read from MC 10-1 (read operation) will be described.

First, MC 10-1 sets the R/W signal to a read mode. After sending bank RAS/CAS address to prepare for reading, read data as an NRZ signal is sent from the addressed memory synchronously with the clock signal CLKout.

For example, it is assumed that data is read from the memory 10-2. Similarly to FIG. 29, the clock signal CLKout is inputted through a path R3 of the lines 7-1 and 7-2. The read data is sent from the memory 10-2 synchronously with the inputted clock signal CLKout. The output read data is inputted through a path R4 of the lines 8-2 and 8-1, via the switch 9. Namely, seen from MC 10-1, an arrival time of the read data from the memory 10-2 becomes "propagation delay of the path R3"+"output time from the input of the clock CLKout to the output of the read data signal in the memory 10-2"+"propagation delay of the path R4". This is same for every memory 10-2–10-7, since the sum of the paths R3 and R4 is equal for every memory. In other words, in the memory 10-2 close to MC 10-1, although the path R3 is short, the path R4 is long that much. In the memory 10-3 distant from MC 10-1, although the path R3 is long, the path R4 is short that much. Namely, either when a memory chip is electrically close to MC 10-1 in its propagation delay or when it is distant, the read data arrives at MC 10-1 at the same time.

Accordingly, in MC 10-1, by using the returned clock signal CLKin, read data from a memory chip at any position can be latched in phase, so that design relating to data timing becomes remarkably easy.

With respect to both write data and read data, the same phase difference can be realized as described above, since there is no disturbance in impedance owing to the directional couplers 7-2–7-7 or 8-2–8-7, and since the same pulse can be sent both forward and backward from the T-shaped coupler. Further, in this case too, by using the T-shaped couplers, a transition time pulse can be sharpened, so that high-speed operation can be realized by effectively coping with waveform distortion such as the skin effect.

Next, further application of this embodiment will be described, referring to FIG. 20.

Figure 20:
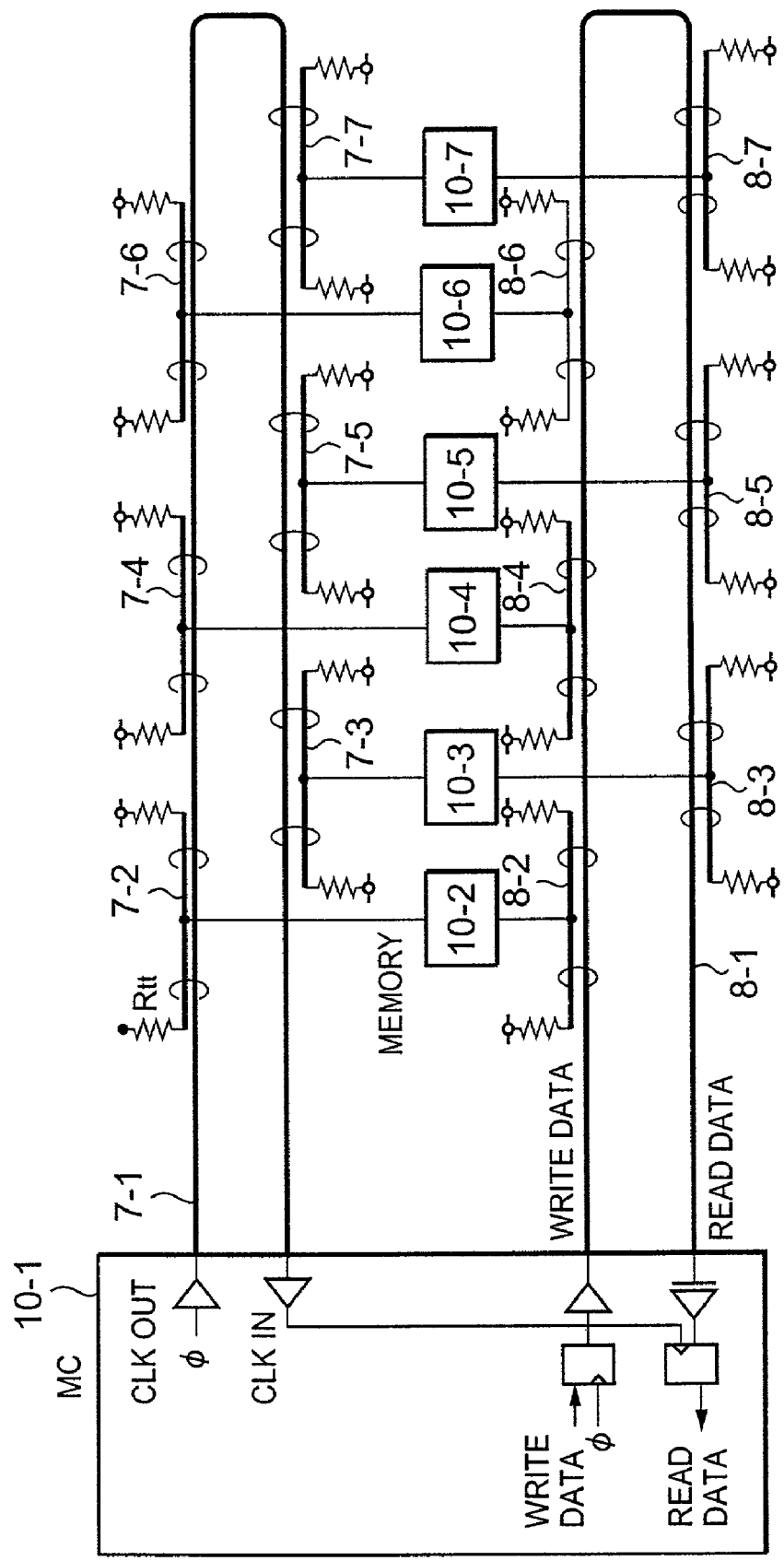
FIG. 20 shows a memory system using a return clock and the T-shaped couplers.

FIG. 20 is different from FIG. 17 in the data signal circuit for MC 10-1. In the present embodiment, interface circuits for write data and for read data are separated, and each circuit has a driver and a receiver. Here, the driver for sending write data and the receiver for receiving read data have the same internal impedance as the characteristic impedance Zo of the main lines 7-1 and 8-1, so that there is no reflected signal wave at the terminals of MC 10-1. According to the described structure, read/write data can be synchronized similarly to FIG. 17, pulse transition can be sharpened, and high-density mounting can be realized. In addition, the terminating resistance for data signal and the switch 9 can be dispensed with, and thus, there is an effect that a lower price can be realized.

Figure 21:
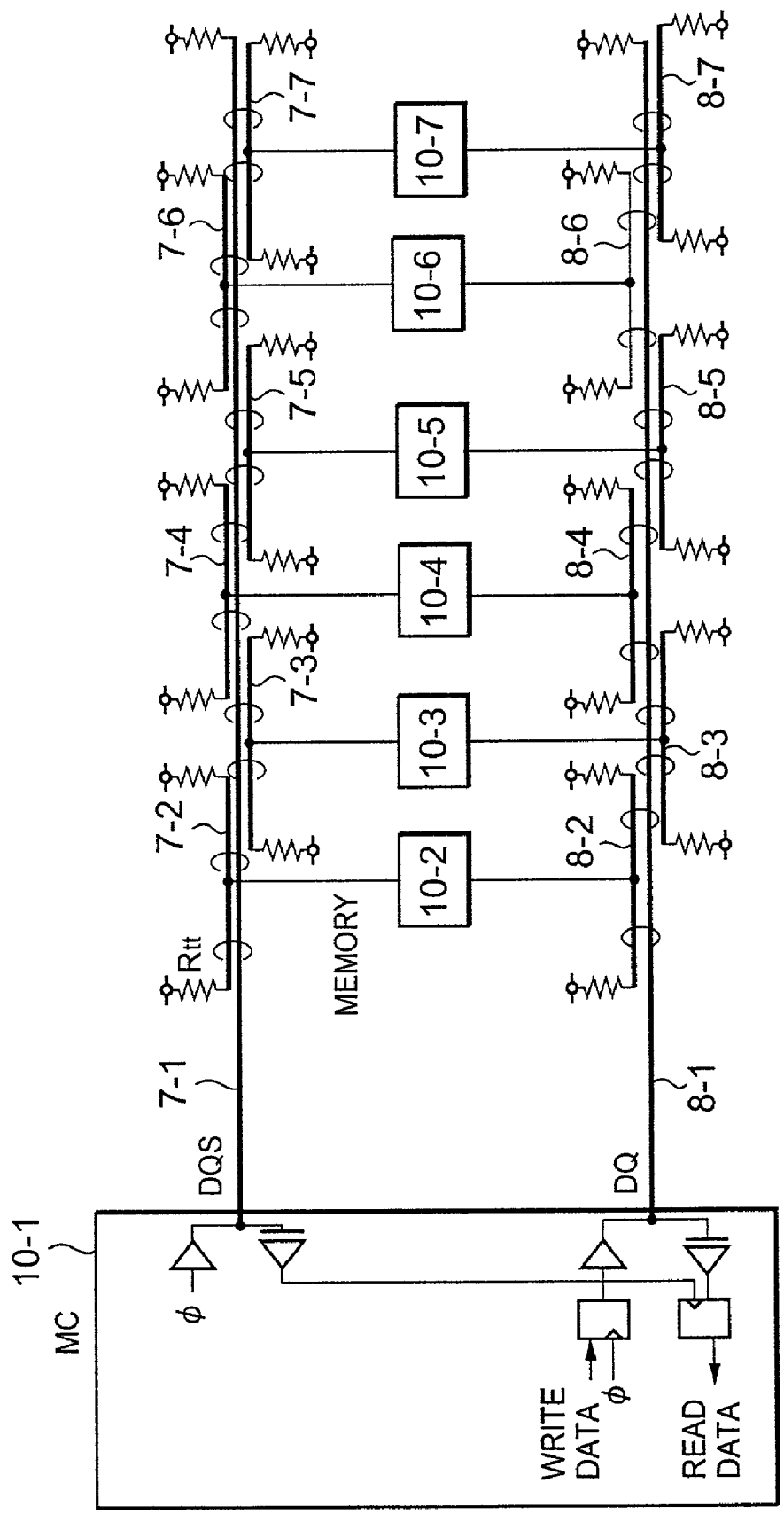
FIG. 21 shows a memory system using DQS signal and the T-shaped couplers.

Next, another embodiment using T-shaped couplers will be described, referring to FIG. 21.

The present embodiment is different from the embodiment of FIG. 17 in that, instead of the CLK signal, a strobe signal (DQS) is used to perform data sending and receiving.

The DQS signal is sent synchronously with the internal clock signal φ of MC 10-1, at the time of data writing. Memory chips 10-2–10-7 use this DQS signal for latching write data (DQ signal) generated in a T-shaped coupler 8-2–8-7 coupled to a main line 8-1. Similarly to the previous embodiment (FIG. 20), since propagation phase difference between the DQS signal and the DQ signal is same for any memory, the mentioned operation is possible.

With respect to read data, the read data (DQ) from each chip is inputted to MC 10-1 through the coupler and the main line 8-1. At the same time with this, also the strobe signal (DQS) is sent from the memory chip that sends the read data. As a result, although the memory chips 10-2–10-7 are arranged such that their delays for MC 10-1 are different, a phase difference between the read data (DQ) and the strobe signal (DQS) is same for any memory chip. Accordingly, MC 10-1 can latch the read data DQ using the DQS signal. In other words, even in the case that wiring is not folded, read data can be synchronously taken in. Further, by using a coupler coupled to the main line toward left and right as shown in FIGS. 7 and 8, for the DQS signal and the DQ signal, it is possible to realize high-density mounting.

Next, an embodiment in which high-density mounting is realized will be described referring to FIG. 22.

Figure 22:
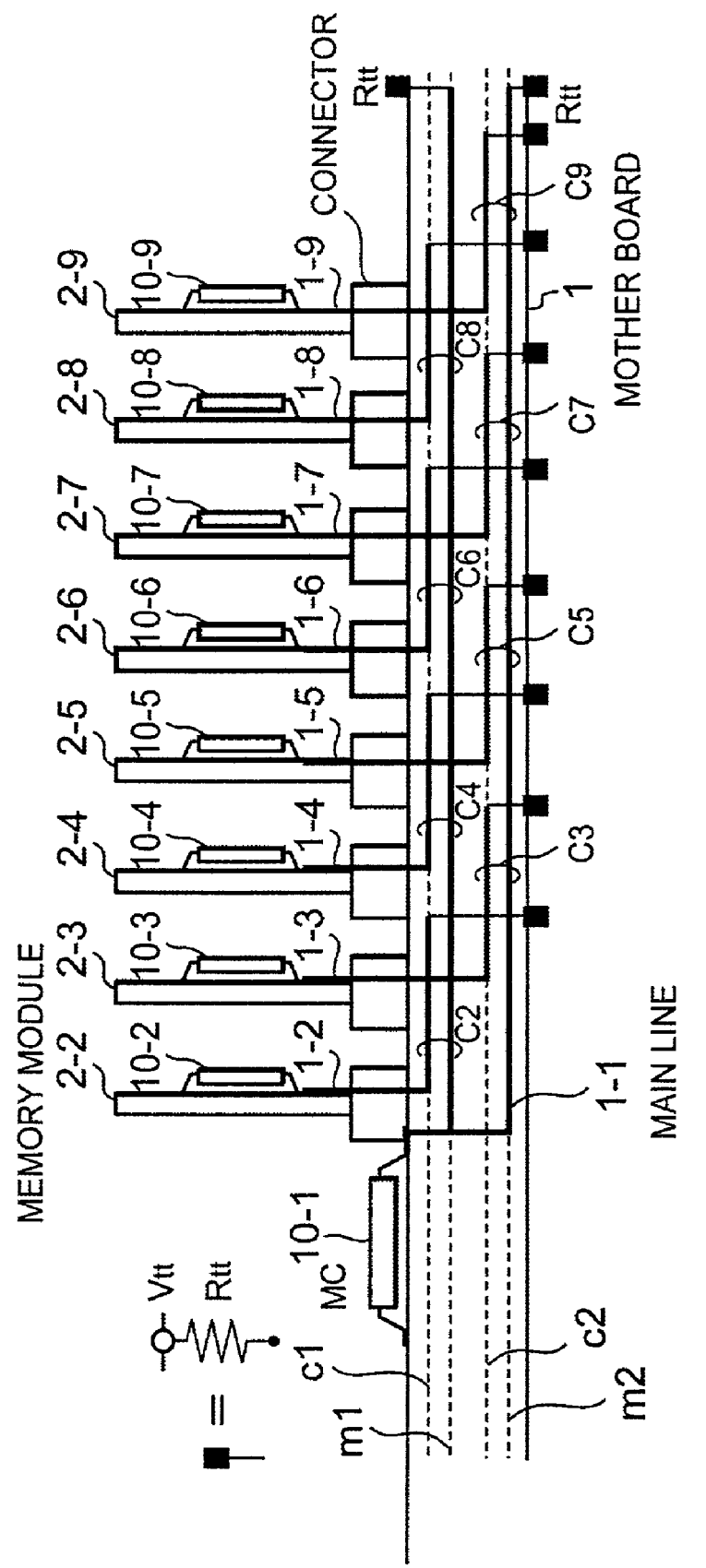
FIG. 22 shows a directional coupling memory system using a folded line.

In FIG. 22, the main line 1-1 is drawn from MC 10-1, and branches in the neighborhood of MC 10-1, and ends of the branch lines are each terminated. Lines from memory modules 2-2–2-9 constitute directional couplers, in combination with the main line 1-1, so as to make data sending and receiving possible. In FIG. 22, the main line 1-1 branches into an upper layer (m1) and a lower layer (m2) of the mother board 1, in the neighborhood of MC 10-1. The lines from the modules 2-2–2-9 are coupled with the branched main line 1-1 in the layers c1 and c2 alternately.

By making the main line 1-1 branch in this way, and by forming the couplers C2–C9 with respect to the branched main line 1-1, it is possible to mount memory modules at the pitch shorter than the wiring length of each coupler C2–C9.

Figure 23:
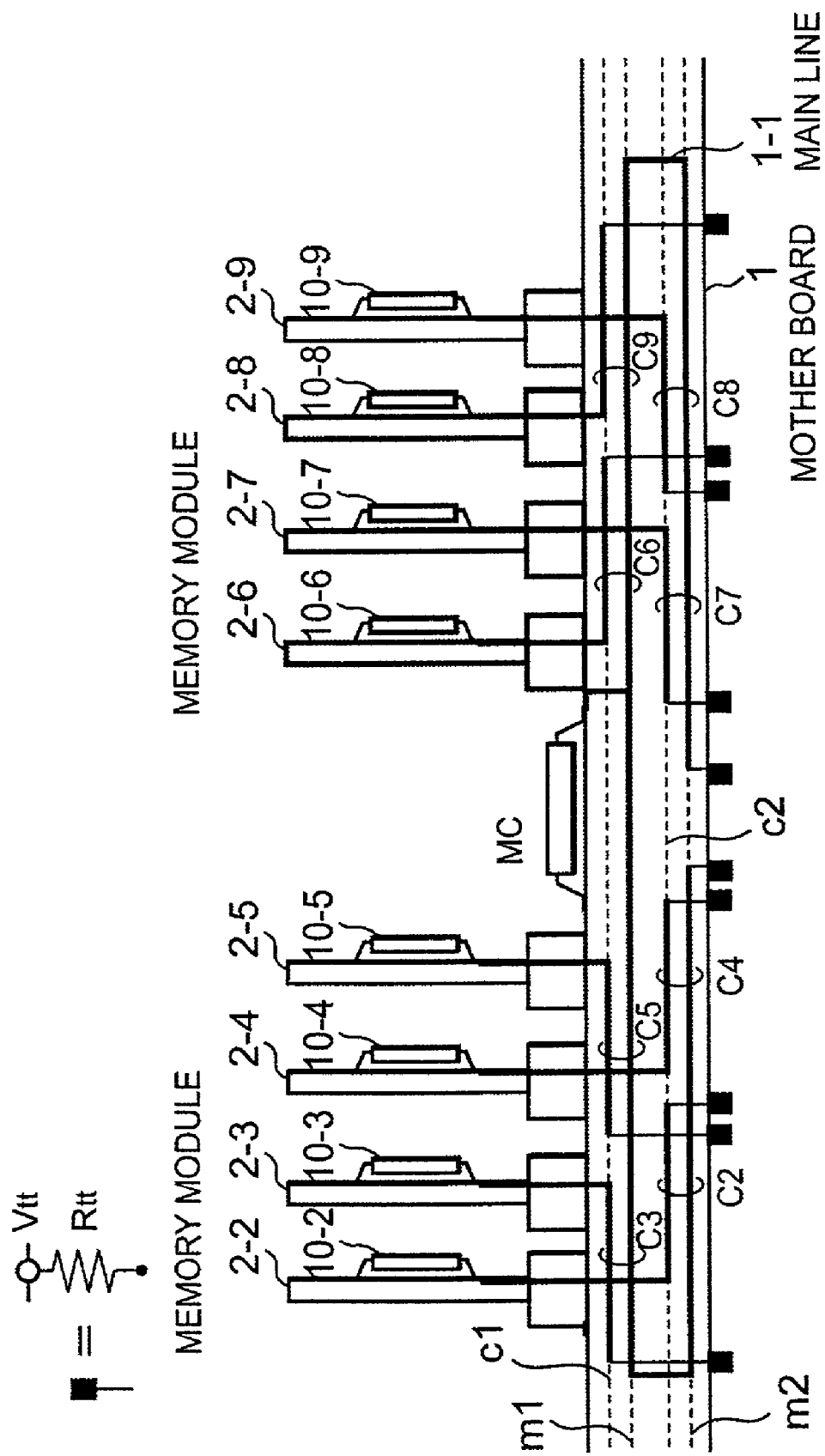
FIG. 23 shows a directional coupling memory system using a folded line.

Further, high-density mounting can be realized in such structure as shown in FIG. 23.

A main line 1-1 drawn from MC 10-1 branches in a wiring layer m1 in the neighborhood of MC 10-1. The branch lines are each folded into a wiring layer m2, and memory modules 2-2–2-9 are arranged so as to form couplers C2–C9 with respect to the folded main lines 1-1. In comparison with FIG. 22, in the present arrangement, MC 10-1 is placed in the center of the memory modules 2-2–2-9. This shows that, in constructing a product, depending on constraint conditions for mounting, such as heat radiation and parts interference, such structure as FIG. 22 or as FIG. 23 may be employed for implementation, increasing degree of freedom of product design.

The above-described coupler may be constructed as another part, i.e., as a coupling element. This embodiment will be described, referring to FIG. 24.

Figure 24:
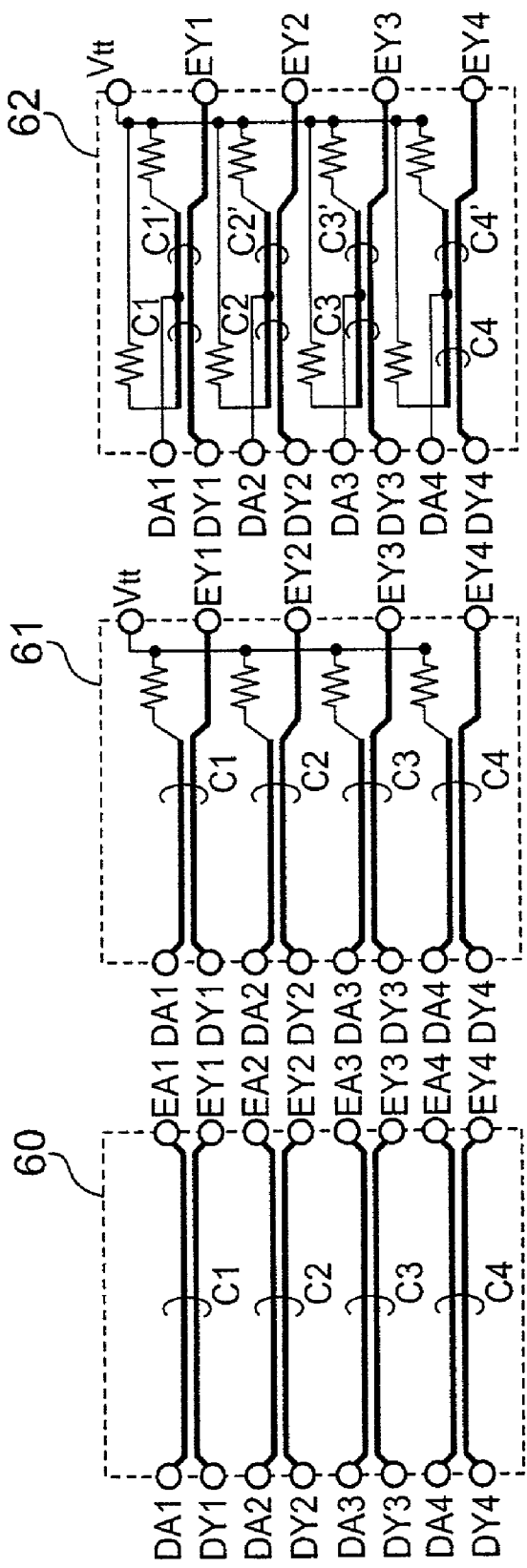
FIG. 24 shows a directional coupling element.

FIG. 24(*a*) shows a chip (element) 60 mounted with many directional couplers. The chip of FIG. 24(*a*) has signal terminals DA1–DA4, DY1–DY4, EA1–EA4, and EY1–EY4, corresponding to four bits. Using a letter i for expressing each number of four bit data signals, the chip 60 is provided therein with a line between the terminals DAi and EAi having characteristic impedance Zo and a line between the terminals DYi and EYi having characteristic impedance Zo, and further a directional coupler Ci between those lines. Coupling between the directional couplers Ci is so small that it can be neglected. This can reduce interference between bits.

As material for this coupler 60, not only lines formed on epoxy type resin, but also lines formed on polyimide resin, ceramic such as alumina or mullite, or silicon have the same function.

According to such structure as shown FIG. 24(a), a multi-bit coupler can be formed as a separate part, not providing it on a mother board. Thus, board density can be increased furthermore, and in addition, degree of freedom of mother board design can be increased.

Further, as shown in FIG. 24(b), a coupler chip 61 may be constructed so as to have built-in terminating resistances Rtt connected to terminating power supply Vtt. In comparison with FIG. 24(a), this embodiment can decrease the number of pins on the chip by providing the terminating resistances in the portions corresponding to the terminals EAi, and in addition, has an effect that terminating resistances can be reduced from the mother board. Further, as shown in FIG. 24(c), a coupler chip may be constructed such that T-shaped couplers are formed in the chip, with terminating resistances being provided in the chip at both ends of each coupler. Although this embodiment is same as FIG. 24(b) in inputs and outputs of signals, both ends of couplers C1, C1' are terminated with a Vtt terminal.

The terminating resistances within the element 61 or 62 of FIG. 24(b) or 24(c) may be controlled by a switch provided within the element 61 or 62, in order to improve degree of freedom of mounting design. For example, control may be carried out such that, by turning on the switch, resistances are made low impedance to realize a state of no terminating resistance as shown in FIG. 24(a), and by turning off the switch, a state having resistances is realized as shown in FIG. 24(b).

Figure 25:
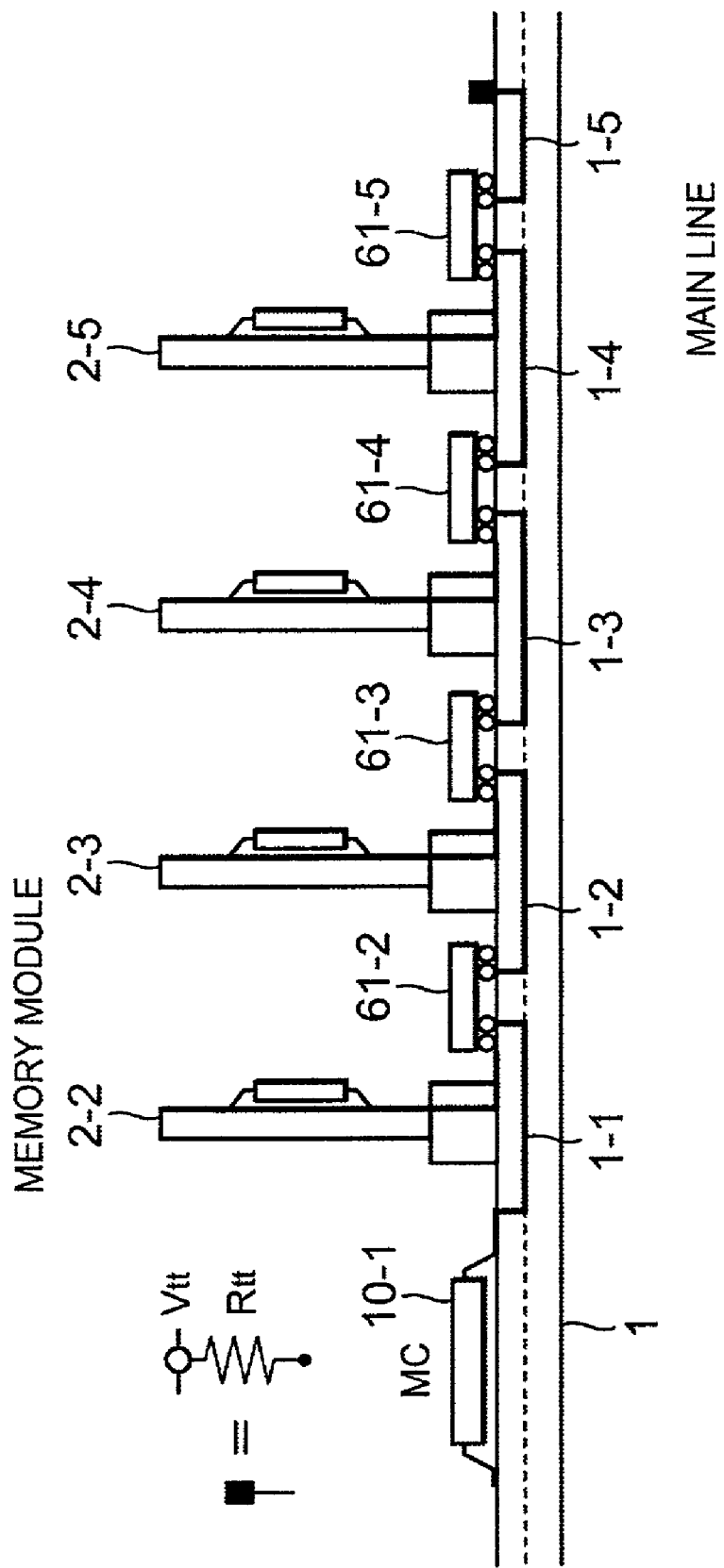
FIG. 25 shows a memory system using the directional coupling elements.

Referring to FIG. 25, an embodiment in which the coupling element of FIG. 24 is applied to a memory system will be described.

FIG. 25 is a schematic wiring diagram including a cross section of a board of a system in which data is sent and received between MC 10-1 and memory chips mounted on memory modules 2-2–2-5. A line 1-1 drawn from MC 10-1 is connected to a terminal of a coupling element 61-2 corresponding to DYi shown in FIG. 24(b), and a terminal of the coupling element 61-2 corresponding to DAi is wired to the memory module 2-2.

Further, a line 1-2 on the mother board is drawn from a terminal EYi of the coupling element 61-2, is connected to a second coupling element 61-3. The wiring is repeated similarly in the following stages, and a line 1-5 from a coupling element 61-5 is terminated.

According to the arrangement and wiring shown in FIG. 25, a data signal from MC 10-1 can be coupled to the memory modules 2-2–2-5 through the coupling elements 61-2–61-5, in order to transmit the data. Further, when the characteristic impedance for the lines 1-1–1-5 and the coupling elements 61-2–61-5 coincides with the characteristic impedance Zo of the line seen from MC 10-1, data can be transmitted without reflection, and this can realize low noise data transfer.

Further, by constructing the coupling elements 61-2–61-5 as separate chips, degree of freedom is given to design of the mother board. Namely, it is possible to mount memory modules such that wiring length of each coupler becomes less than the limitation, to realize high-density mounting. Further, it is not necessary to provide couplers in the layer structure of the mother board 1, and thus, the number of the layers can be reduced, and the board can be cheaper. Further, by providing the coupling elements as separate parts, it is possible to suppress dispersion in parts production, in comparison with the case that couplers are provided within the whole board of the mother board 1.

Here, of course, the coupling elements 61-2–61-5 can be mounted on the mother board 1, not only on the side of the memory modules 2-2 but also on the back side.

Figure 26:
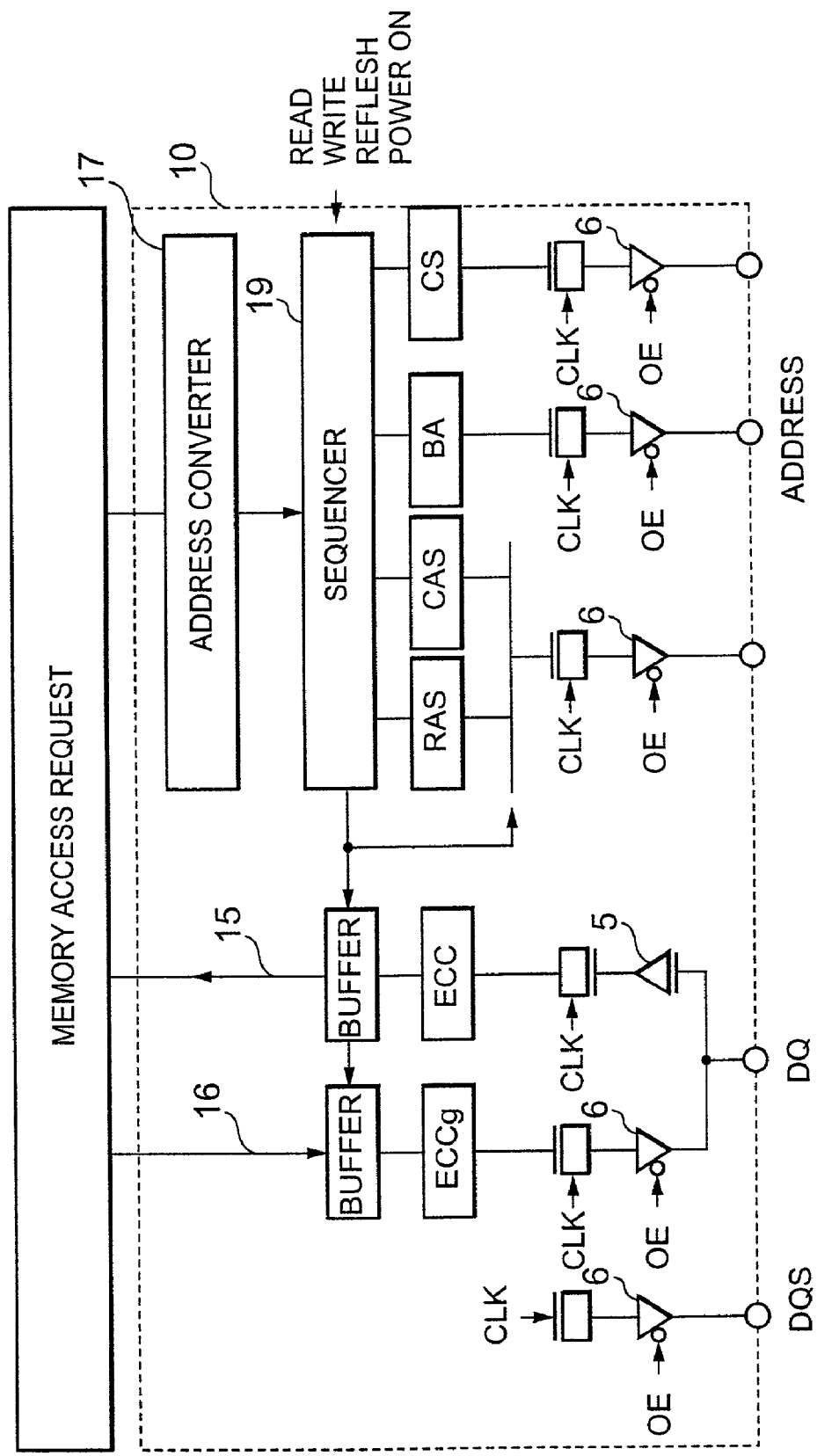
FIG. 26 is a block diagram showing a memory controller.

Next, FIG. 26 shows an internal block diagram of MC suitable for data transfer using directional couplers.

A reference numeral 10 refers to a dotted line block indicating the controls of the MC controller. Access to a memory is carried out by means of an address converter 17, a read data signal 15, and write data signal 16. Namely, in write access, a logical address is converted to a physical address by address calculation in the address converter 17, and the data signal 16 is sent to the memory corresponding to the physical address. Within MC 10, to this end, a sequencer 19 controls various blocks at appropriate times suitable for memories connected to MC 10, satisfying also other requirements. For example, the sequencer 19 carries out management of sequence timing with respect to switching between RAS and CAS, and sending of a base address BA and a chip select CS. In addition, if necessary, ECC (error correct code) for data is generated in a generator ECCg, and the data added with ECC is transmitted.

Similarly, read access is carried out by sending read request to a memory, switching an address between RAS and CAS, and sending a base address BA and a chip select CS. In addition, in some cases, a read/write switching signal and a data mask signal may be included, of course. When it is discerned that the memory sends the read data, the data is received through a receiver 5, data errors are detected and corrected in an ECC part. Thereafter, MC controller 10 functions to return the data in response to the read request. Here, the receiver 5 has also a function of demodulating an RTZ signal to an NRZ signal. In addition, the sequencer 19, of course, performs enable control of the driver 6, refresh control of DRAM, power-on control, and the like.

Since MC has such functions, it can perform storing (write) and reference (read) of data into and from a memory, in response to a memory access request from another part of the system, such as a DMA transfer request from an I/O side or a memory access request from a processor.

Figure 27:
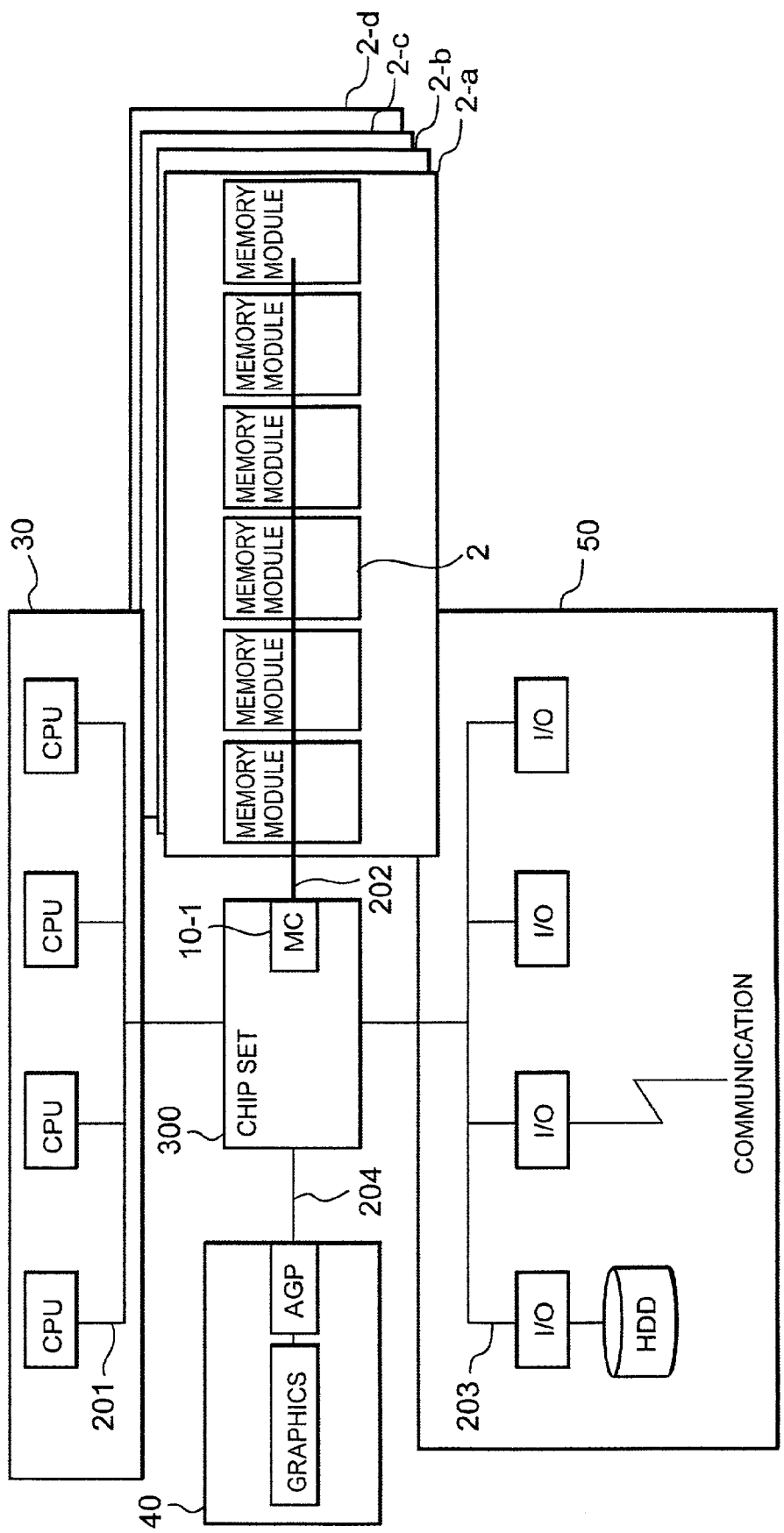
FIG. 27 shows a system having a memory bus using a folded main line.

Next, FIG. 27 shows an embodiment that applies the memory bus system using directional couplers according to the present invention.

In FIG. 27, four CPUs and a chip set 300 are connected with one another through a processor bus 201. Further, the chip set 300 contains a memory controller for controlling DRAMs and is mutually connected to those DRAMs through a memory bus 202. Further, the chip set 300 is mutually connected to I/O port LSIs for connecting peripherals such as PCI, through an I/O bus 203. Further, the chip set 300 is connected to a graphics control LSI as a graphics port, through a graphics bus 204.

These buses 201–204 are connected to the chip set 300. The chip set 300 controls data sending and receiving between those buses 201–204.

Here, in the memory bus 202, data transfer is carried out using the directional couplers of the present invention. By this, high-speed operation of memory access is possible, throughput is improved, and latency becomes shorter, so that system performance is improved.

Figure 28:
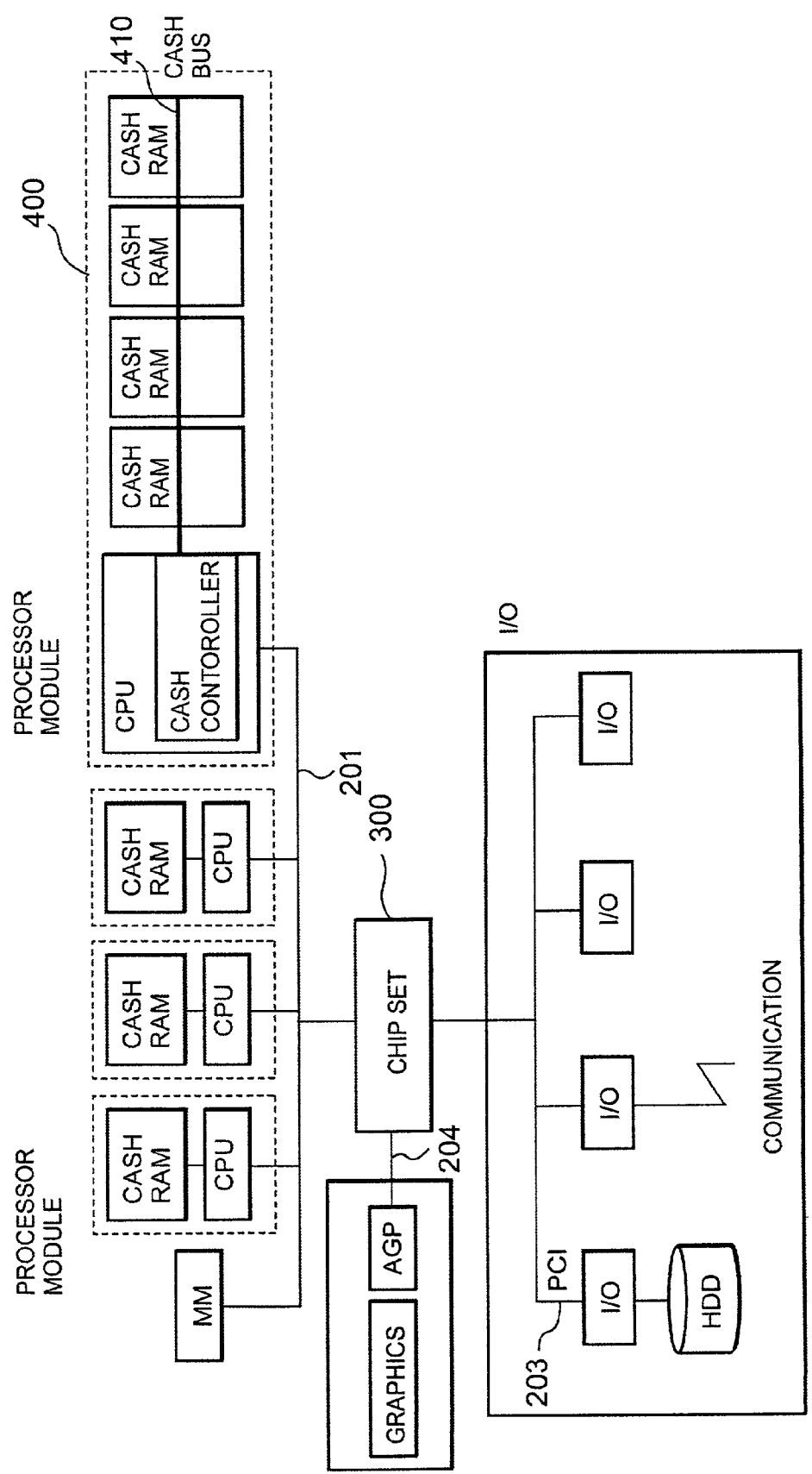
FIG. 28 shows a system having a cache memory bus using a folded main line.

Further, as shown in FIG. 28, the directional couplers of the present invention may be applied to a cache memory bus 410 within a processor module 400 to obtain similar effects. In that case, the couplers are formed within the processor module. Employing a technique that can mount many semiconductor devices within one package, such as MCM (Multi Chip Module) for example, it is possible to couple a processor containing a built-in cache controller and cache memories by means of the couplers formed in the package, so that high-speed data transfer is realized.

By folding a main line, and forming directional couplers with respect to this folded main line, it is possible to make the interval between memory module about half the wiring length of each directional coupler.

By using a T-shaped coupler, the waveform become steeper to have an effect of equalizing the skin effect. This makes high-speed operation possible.

In the case of a plurality of memories, by folding lines of a clock signal and a data signal from a memory controller, and by inputting the clock signal again, it is possible to eliminate a time difference for the read data and write data. This makes system design remarkably easy.

What is claimed is:

1. A bus system for carrying out data transfer between one bus master and a plurality of bus slaves, comprising:
   directional couplers are formed by arranging respective parts of lines drawn from said bus slaves, without being in contact with, in the neighborhood of, and in parallel with a line drawn from the bus master,
   wherein said line drawn from said bus master to a terminating resistance is wired being folded,
   wherein said directional couplers are formed by arranging said parts of the lines drawn from said bus slaves one after another alternatively with respect to a first line part of the line drawn from the bus master ranging from the bus master to a fold of said line drawn from the bus master and with respect to a second line part of the line drawn from the bus master ranging from the fold to the terminating resistance
   wherein two lines are connected to each other to constitute a directional coupler that is formed by arranging said two lines, in the neighborhood of and in parallel with said line drawn from said bus master to the terminating resistance, in order to transmit data between said bus master and each of said bus slaves,
   wherein a line is arranged from said each of the bus slaves to a junction of said two lines, to form a T-shape,
   wherein both ends of said T-shape directional coupler on a side of said each of the bus slaves are terminated for impedance matching, and
   wherein two directional couplers each having a positive forward crosstalk coefficient are connected to each other in a T-shape, so that, in data transfer of an NRZ (Non-Return to Zero) signal from the bus master, the directional coupler closer to said bus master generates positive forward crosstalk, the directional coupler distant from said bus master generates positive backward crosstalk, and, said forward and backward crosstalks are superimposed to generate an RTZ (Return to Zero) signal having a sharp rise or fall in a bus slave.

2. A bus system for carrying out data transfer between one bus master and a plurality of bus slaves, comprising:
   directional couplers are formed by arranging respective parts of lines drawn from said bus slaves, without being in contact with, in the neighborhood of, and in parallel with a line drawn from the bus master,
   wherein said line drawn from said bus master to a terminating resistance is wired being folded,
   wherein said directional couplers are formed by arranging said parts of the lines drawn from said bus slaves one after another alternatively with respect to a first line part of the line drawn from the bus master ranging from the bus master to a fold of said line drawn from the bus master and with respect to a second line part of the line drawn from the bus master ranging from the fold to the terminating resistance
   wherein two lines are connected to each other to constitute a directional coupler that is formed by arranging said two lines, in the neighborhood of and in parallel with said line drawn from said bus master to the terminating resistance, in order to transmit data between said bus master and each of said bus slaves,
   wherein a line is arranged from said each of the bus slaves to a junction of said two lines, to form a T-shape,
   wherein both ends of said T-shape directional coupler on a side of said each of the bus slaves are terminated for impedance matching,
   wherein lines for a clock signal and for data signal are drawn from a memory controller of a memory system as said bus master, and folded,
   wherein lines for the clock signal and for the data signal drawn from each of memories as the bus slaves constitute T-shaped couplers in combination with the lines drawn from said memory controller,
   wherein regarding respective sets of said lines for the clock signal and for the data signal drawn from said memories, the lines are arranged one after another alternatively with respect to the line parts ranging from said memory controller to the fold and with respect to the line parts ranging from said fold afterward, to form the T-shaped couplers, so that said respective T-shaped couplers for said clock signal and for said data signal have same data propagation delay between each of said memories and said memory controller,
   wherein the line for the clock signal is drawn from the memory controller and folded,
   wherein said clock signal is inputted again to said memory controller after passing the folded line,
   wherein a switch is connected to both ends of the line for the data signal for said memory controller,
   wherein said switch is turned in a read operation and in a write operation so that a propagation direction of the data signal for said memory controller becomes same as a propagation direction of the clock signal,
   wherein each of the lines drawn from the memories and the line drawn from said memory controller constitute a T-shaped coupler,
   wherein in the write operation:
   said memory controller sends write data to a memory synchronously with the clock signal; said switch switches the propagation direction of the data signal into a same direction as the propagation direction of the clock signal; and said memory in question uses said clock signal sent, to latch the write data that arrives in phase with the clock signal, and
   wherein in the read operation:
   one of the memories sends read data synchronously with said clock signal received; said switch switches the propagation direction of the data signal reversely to said write operation so as to be a same direction as the propagation direction of the clock signal; and the clock signal returned to said memory controller is used to latch said read data from said memory.

3. A bus system for carrying out data transfer between one bus master and a plurality of bus slaves, comprising:
directional couplers are formed by arranging respective parts of lines drawn from said bus slaves, without being in contact with, in the neighborhood of, and in parallel with a line drawn from the bus master,
wherein said line drawn from said bus master to a terminating resistance is wired being folded,
wherein said directional couplers are formed by arranging said parts of the lines drawn from said bus slaves one after another alternatively with respect to a first line part of the line drawn from the bus master ranging from the bus master to a fold of said line drawn from the bus master and with respect to a second line part of the line drawn from the bus master ranging from the fold to the terminating resistance
wherein two lines are connected to each other to constitute a directional coupler that is formed by arranging said two lines, in the neighborhood of and in parallel with said line drawn from said bus master to the terminating resistance, in order to transmit data between said bus master and each of said bus slaves,
wherein a line is arranged from said each of the bus slaves to a junction of said two lines, to form a T-shape,
wherein both ends of said T-shape directional coupler on a side of said each of the bus slaves are terminated for impedance matching,
wherein lines for a clock signal and for data signal are drawn from a memory controller of a memory system as said bus master, and folded,
wherein lines for the clock signal and for the data signal drawn from each of memories as the bus slaves constitute T-shaped couplers in combination with the lines drawn from said memory controller,
wherein regarding respective sets of said lines for the clock signal and for the data signal drawn from said memories, the lines are arranged one after another alternatively with respect to the line parts ranging from said memory controller to the fold and with respect to the line parts ranging from said fold afterward, to form the T-shaped couplers, so that said respective T-shaped couplers for said clock signal and for said data signal have same data propagation delay between each of said memories and said memory controller,
wherein the lines for the clock signal and for the data signal are drawn from the memory controller, and folded
wherein said clock signal is inputted again to said memory controller after passing the folded line,
wherein said data signal is inputted again to said memory controller after passing the folded line,
wherein the lines are wired such that a signal propagation delay becomes same between a propagation direction of the data signal and a propagation direction of the clock signal of said memory controller,
wherein said memory controller sends write data synchronously with the clock signal, and said memories latch write data using the clock signal sent, and
wherein said memories send read data synchronously with said clock signal received, and said read data from said memories is latched by using the clock signal returned to said memory controller.

4. A bus system for carrying out data transfer between one bus master and a plurality of bus slaves, comprising:
directional couplers wherein, respective parts of lines drawn from the bus slaves are arranged, without being in contact with, in the neighborhood of, and in parallel with a line drawn from the bus master, thereby connecting the line from the bus mater with each of the lines from the bus slaves, and
wherein the line drawn from the bus master to a terminating resistance is formed being folded,
the bus slaves connected to a first line part of the line drawn from the bus master, ranging from the bus master to the fold of the line, and the bus slaves connected to a second line part of the line drawn from the bus master ranging from the fold to the terminating resistance are arranged one after another alternatively, and
a pitch between each of the adjacent slaves is about half of a coupling length of the directional couplers.

5. A bus system for carrying out data transfer between one bus master and a plurality of bus slaves,
wherein a line drawn from the bus master branches into a first and a second branch lines, in the neighborhood of the bus master,
directional couplers, wherein parts of the lines drawn from the bus slaves are arranged without being in contact with, in the neighborhood of, and in parallel with the first and second branch lines of the bus master, thereby connecting the first and the second branch lines to each of the lines drawn from the bus slaves are provided,
the bus slaves connected to the first branch line of the bus master and the bus slaves connected to the second branch line of the bus master are arranged one after another alternatively, and
a pitch between each of the adjacent slaves is about half of a coupling length of the directional couplers.

6. A bus system for carrying out data transfer between one bus master and a plurality of bus slaves,
wherein a line drawn from the bus master branches into a first and a second branch lines, in the neighborhood of the bus master;
directional couplers wherein parts of the lines drawn from the bus slaves are arranged without being in contact with, in the neighborhood of, and in parallel with the first and second branch lines of the bus master, thereby connecting the first and the second branch lines to each of the lines drawn from the bus slaves are provided, and
wherein each of the first and second branch lines ranging from the bus master to a terminating resistance is formed being folded,
the bus slaves connected to the first branch line in a range from the bus master to the fold in a side of the bus master and the bus slaves connected to the first branch line in a range from the fold to the terminating resistance in a side of the terminal resistance are arranged one after another alternatively,
the bus slaves connected to the second branch line in a range from the bus master to the fold in the bus master side and the bus slaves connected to the second branch line in a range from the fold to the terminating resistance in the terminating resister side are arranged one after another alternatively,
a pitch between each of the plurality of slaves adjacent to each other, each connected to the first branch line is about half of a coupling length of the directional couplers, and
a pitch between the plurality of slaves adjacent to each other, each connected to the second branch line is about half of the coupling length of the directional couplers.

7. A printed circuit board using the bus system of claim 4, wherein the directional couplers, which are formed by the line drawn from the bus master and the lines drawn from the bus slaves, are formed in the printed circuit board, and the directional couplers are formed in a same wiring layer of the printed circuit board.

8. The printed circuit board using the bus system of claim 4, wherein the directional couplers, which are formed by the line drawn from the bus master and the lines drawn from the bus slaves, are formed in the printed circuit board, and the directional couplers are formed in different wiring layers of the printed circuit board.

9. A bus system for carrying out data transfer between one bus master and a plurality of bus slaves, comprising:

directional couplers wherein respective parts of lines drawn from the bus slaves to terminating resistances are arranged, without being in contact with, in the neighborhood of, and in parallel with a line drawn from the bus master to a terminating resistance, in order to carry out data sending and receiving between the bus master and the bus slaves, the lines from the bus slaves are arranged one after another alternatively on both sides of the line from the bus master in a same layer of board as the bus master, and a pitch between the slaves arranged in one side of the line from the bus master and the slaves arranged in another side of the line from the bus master is about half of a coupling length of the directional couplers.

10. A memory system using the bus system of claim 4, wherein the bus master has a function of a memory controller, the bus slaves each have a function of a memory from which data can be read and written, a memory module mounted with many memories as the bus slaves is connected through a connector to a printed circuit board that is mounted with the memory controller as the bus master, and the connector is connected to the line from the bus master via the directional couplers.

11. A memory system of claim 10, wherein the memories are mounted on both sides of a printed circuit board of the memory module.

12. The bus system for carrying out data transfer between one bus master and at least one bus slave, comprising:

a directional coupler wherein a part of a line drawn from said at least one bus slave is arranged, without being in contact with, in the neighborhood of, and in parallel with a line drawn from the bus master to a terminating resistance in order to transmit data between the bus master and said at least one bus slave, and wherein the line from said at least one bus slave is formed in a T-shape, a horizontal portion of the T-shape of the lines from said at least one bus slave opposes to the line from the bus master, and is terminated for impedance matching, and a vertical portion of the T-shape of the line from said at least one bus slave is connected to said at least one bus slave and formed of one line.

13. A bus system of claim 12, wherein the directional coupler has a positive forward crosstalk coefficient, the directional coupler further includes:

a first directional coupler portion which connects the line from the bus slave at one end of the horizontal portion of the T-shape to the line from the bus master, and which is formed in a side closer to the bus slave, and a second directional coupler portion which connects the line from the bus slave at another end of the horizontal portion of the T-shape to the line from the bus master, and which is formed in a side distant from the bus slave, and in data transfer by an NRZ (Non-Return to Zero) signal from the bus master to the bus slaves, the first directional coupler closer to the bus master generates positive forward crosstalk, the second directional coupler distant from the bus master generates positive backward crosstalk, and, the positive forward and backward crosstalks are superimposed at a connecting point of the first and the second direction couplers to generate an RTZ (Return To Zero) signal having a sharp rise or fall in a bus slave.

14. A memory system using the bus system of claim 12, wherein the bus slaves are formed in plural numbers, the bus slaves are memories, the bus master is a memory controller, the line drawn from the memory controller to a terminating resistance is formed being folded, the line from the memory controller transmits a clock signal and a data signal, the memories connected to a first line portion of the line from the memory controller in a range from the memory controller to the fold, and the memories connected to the second line portion of the line from the memory controller in a range from the fold to the terminating resistance, are arranged one after another alternatively, and the T-shaped couplers for each of the clock signal and for the data signal has same data propagation delay between each of the memories and the memory controller.

15. The memory system according to claim 14, wherein the line for a clock signal from the memory controller is connected again to the memory controller after the line is folded, and the memory system comprising a switch which turns both ends of the folded line for the data signal, so as to connect the switched one end to the memory controller, wherein the switch is turned in a read operation and in a write operation from and into the memories from the memory controller, so that a propagation direction of the data signal for the memory controller becomes same as a propagation direction of the clock signal, in the write operation, the memory controller sends write data to a memory synchronously with the clock signal, the switch switches the propagation direction of the data signal into a same direction as the propagation direction of the clock signal, and the memory in question uses the clock signal sent, to latch the write data that arrives in phase with the clock signal, and in the read operation, one of the memories sends read data synchronously with the clock signal received, the switch switches the propagation direction of the data signal reversely to the write operation so as to be a same direction as the propagation direction of the clock signal, and the clock signal returned to the memory controller is used to latch the read data from the memory.

16. The memory system according to claim 14, wherein the lines for the clock signal and for the data signal are drawn from the memory controller, and folded, the clock signal is inputted again to the memory controller after passing the folded line, the data signal is inputted again to the memory controller after passing the folded line, the lines are wired such that a signal propagation delay becomes same between a propagation direction of the data signal and a propagation direction of the clock signal of the memory controller, the memory controller sends write data synchronously with the clock signal, and the memories latch write data using the clock signal sent, and the memories send read data synchronously with the clock signal received, and the read data from the memories is latched by using the clock signal returned to the memory controller.

17. A memory system using the bus system of claim 12, wherein the bus slaves are formed in plural numbers, the bus slaves are memories, the bus master is the memory controller, a line drawn from the memory controller to a terminating resistance is formed by being folded, the line from the memory controller transmits a data signal and a data strobe signal, the memories connected to a first line portion of the line from the memory controller ranging from the memory controller to the fold of the line, and the memories connected to the second line portion of the line from the memory controller ranging from the fold of the line to the terminating resistance, are arranged one after another alternatively, and the memory controller transmits write data synchronously with the data strobe signal and latches read data from the memories using the data strobe signal returned to the memory controller.

18. A directional coupling device comprising built-indirectional couplers corresponding to a plurality of signals, which are formed by arranging two lines having a constant line characteristic impedance in parallel, without being contact with each other, and in the neighborhood of each other, wherein as to each of the built-in directional couplers, one of the lines in the built-in directional coupler concerned is formed in a T-Shape, a horizontal portion of the T-shape of one of the lines opposes to another line, and is terminated for impedance matching, and a vertical portion of the T-shape of one of the lines is formed of one line.

\* \* \* \* \*